(12) United States Patent
Ko et al.

(10) Patent No.: US 12,334,018 B2
(45) Date of Patent: Jun. 17, 2025

(54) DISPLAY APPARATUS COMPRISING PIXEL CIRCUIT

(71) Applicant: LG DISPLAY CO., LTD., Seoul (KR)

(72) Inventors: Intae Ko, Daegu (KR); JongHyun Park, Gyeongsangbuk-do (KR); ChangSoo Kim, Paju-si (KR); Soonhwan Hong, Goyang-si (KR)

(73) Assignee: LG Display Co., Ltd. (KR)

( * ) Notice: Subject to any disclaimer, the term of this patent is extended or adjusted under 35 U.S.C. 154(b) by 0 days.

(21) Appl. No.: 18/672,483

(22) Filed: May 23, 2024

(65) Prior Publication Data

US 2025/0006131 A1 Jan. 2, 2025

(30) Foreign Application Priority Data

Jun. 30, 2023 (KR) .......................... 10-2023-0085177

(51) Int. Cl.
  *G09G 3/3241* (2016.01)
  *H10K 59/80* (2023.01)
  *G09G 3/20* (2006.01)

(52) U.S. Cl.
  CPC ......... *G09G 3/3241* (2013.01); *H10K 59/879* (2023.02); *G09G 3/2096* (2013.01); *G09G 2300/0426* (2013.01); *G09G 2300/0819* (2013.01); *G09G 2300/0842* (2013.01); *G09G 2310/08* (2013.01); *G09G 2380/10* (2013.01)

(58) Field of Classification Search
  None
  See application file for complete search history.

(56) References Cited

U.S. PATENT DOCUMENTS

| | | | |
|---|---|---|---|
| 9,805,650 B2* | 10/2017 | Gu | G09G 3/3233 |
| 10,679,556 B2* | 6/2020 | Yang | G09G 3/2003 |
| 2024/0296793 A1* | 9/2024 | Yuan | G09G 3/3225 |

FOREIGN PATENT DOCUMENTS

| | | |
|---|---|---|
| KR | 2022-0095467 A | 7/2022 |
| KR | 2022-0165958 A | 12/2022 |
| KR | 2023-0033376 A | 3/2023 |

* cited by examiner

*Primary Examiner* — Christopher J Kohlman
(74) *Attorney, Agent, or Firm* — Fish & Richardson P.C.

(57) ABSTRACT

A display apparatus includes a mode controller configured to generate a first control signal and a second control signal, a gate drive circuit configured to generate a light-emitting signal, a first scan signal, and a second scan signal, a shared circuit connected to a reference voltage line configured to provide a reference voltage, the shared circuit comprising a first transistor configured to operate based on the first scan signal, and a second transistor connected to the first transistor in series and configured to operate based on the second scan signal and a first pixel circuit connected to the mode controller and the gate drive circuit, wherein the first pixel circuit includes a driving transistor, a third transistor configured to operate based on the light-emitting signal and connected to the second transistor, a fourth-first transistor configured to operate based on the first control signal, a fourth-second transistor configured to operate based on the second control signal, a first light-emitting element connected to the fourth-first transistor, a second light-emitting element connected to the fourth-second transistor and a capacitor connected to the first transistor, the second transistor, the third transistor, and the driving transistor.

23 Claims, 15 Drawing Sheets

DISPLAY APPARATUS COMPRISING PIXEL CIRCUIT

CROSS-REFERENCE TO RELATED APPLICATION

This application claims the priority of Korean Patent Application No. 10-2023-0085177 filed on Jun. 30, 2023, which is hereby incorporated by reference in its entirety.

BACKGROUND

Field of the Disclosure

The present disclosure relates to a display apparatus comprising a pixel circuit.

Description of the Background

Display devices include organic light-emitting diodes (OLED) configured to autonomously emit light. The display devices are being variously used because the display device has a high response speed, high luminous efficiency, high brightness, and a large viewing angle. The display device adjusts the organic light-emitting element by adjusting the gradation of the pixels, which are arranged in a matrix shape, in accordance with video data. The pixel may include a pixel circuit, and various voltages may be inputted to the pixel circuit to operate the pixel.

The voltage inputted to the pixel circuit forms a path of an electric current flow on the pixel circuit. In some instances, several situations, such as a leak of electric current, may occur on the path of the electric current flow. For example, a reference voltage in the pixel circuit may be provided to a light-emitting element through a switching transistor connected to an anode of the light-emitting element. In this case, a range of a voltage, which may be used as a reference voltage, may be restricted to suppress a leak of current to the light-emitting element. The expression quality of black gradation may be improved as a usable range of the reference voltage increases. Accordingly, there is a need for a solution to suppress a leak of current to the light-emitting element while improving the usable range of the reference voltage.

SUMMARY

Accordingly, the present disclosure is directed to a display apparatus comprising a pixel circuit that substantially obviates one or more of problems due to limitations and disadvantages described above.

More specifically, the present disclosure is to provide a display apparatus that may use a shared circuit to increase a usable range of a reference voltage and minimize a leakage current to a light-emitting element.

The present disclosure is not limited to the above-mentioned, and other features, which are not mentioned above, may be clearly understood by those skilled in the art from the following descriptions.

Additional features and advantages of the disclosure will be set forth in the description which follows and in part will be apparent from the description, or may be learned by practice of the disclosure. Other advantages of the present disclosure will be realized and attained by the structure particularly pointed out in the written description and claims hereof as well as the appended drawings.

To achieve these and other advantages and in accordance with the present disclosure, as embodied and broadly described, a display apparatus includes a mode controller configured to generate a first control signal and a second control signal, a gate drive circuit configured to generate a light-emitting signal, a first scan signal, and a second scan signal, a shared circuit connected to a reference voltage line configured to provide a reference voltage, wherein the shared circuit includes a first transistor configured to operate based on the first scan signal, and a second transistor connected to the first transistor in series and configured to operate based on the second scan signal and a first pixel circuit connected to the mode controller and the gate drive circuit, wherein the first pixel circuit includes a driving transistor, a third transistor configured to operate based on the light-emitting signal and connected to the second transistor, a fourth-first transistor configured to operate based on the first control signal, a fourth-second transistor configured to operate based on the second control signal, a first light-emitting element connected to the fourth-first transistor, a second light-emitting element connected to the fourth-second transistor and a capacitor connected to the first transistor, the second transistor, the third transistor, and the driving transistor.

In another aspect of the present disclosure, a display apparatus includes a shared circuit providing a reference voltage Vref, configured to operate based on a first scan signal and a second scan signal, and including a first node N1; and first, second and third pixel circuits electrically connected to the shared circuit, wherein the second pixel circuit is adjacent to at least one of the first and third pixel circuits and including at least two light-emitting elements configured to emit light with a different color from light emitted from first and second light-emitting elements of the first pixel circuit, wherein the third pixel circuit is adjacent to at least one of the first and second pixel circuits and including at least two light-emitting elements configured to emit light with a different color from light emitted from first and second light-emitting elements of the first pixel circuit and first and second light-emitting elements of the second pixel circuit, and wherein the shared circuit and the first, second and third pixel circuits are electrically connected through the first node N1 to receive at least one of the reference voltage Vref, a high-potential voltage VDD, a low-potential voltage VSS, a light-emitting signal EM(N), a data voltage Vdata, and an initialization voltage Vini.

Other detailed matters of the exemplary aspects are included in the detailed description and the drawings.

According to the display apparatus according to the present disclosure, it is possible to provide the reference voltage by using the shared circuit, thereby increasing the usable range of the reference voltage and minimizing a leakage current to the light-emitting element.

The effects according to the present disclosure are not limited to the contents exemplified above, and more various effects are included in the present disclosure.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
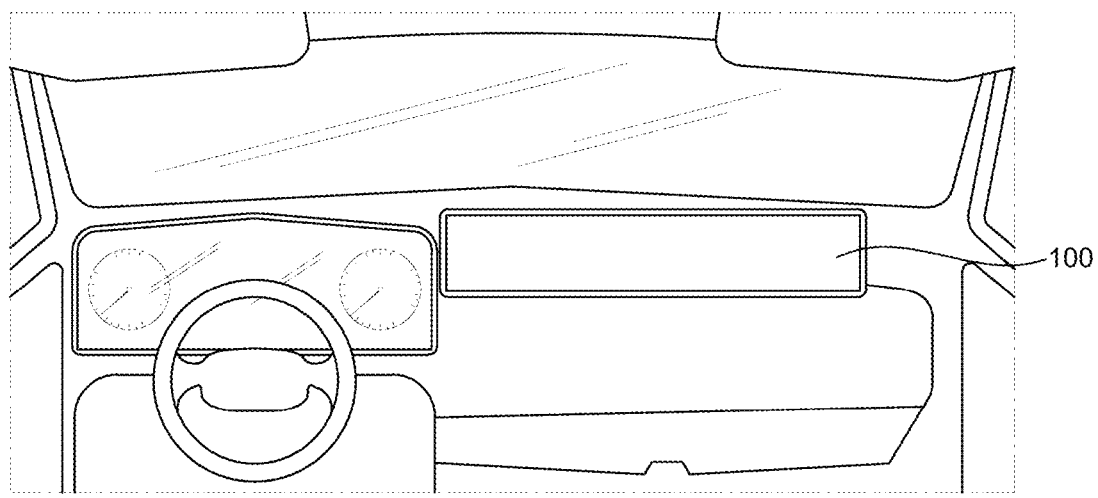
FIG. 1 is a view illustrating an example of a display apparatus according to an aspect of the present disclosure.

Advantages and characteristics of the present disclosure and a method of achieving the advantages and characteristics will be clear by referring to exemplary aspects described below in detail together with the accompanying drawings. However, the present disclosure is not limited to the exemplary aspects disclosed herein but will be implemented in various forms. The exemplary aspects are provided by way of example only so that those skilled in the art may fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary aspects of the present disclosure are merely examples, and the present disclosure is not limited thereto. Like reference numerals generally denote like elements throughout the disclosure. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

In describing components of the exemplary aspect of the present disclosure, terminologies such as first, second, A, B, (a), (b), and the like may be used. These terminologies are used to distinguish a component from the other component, but a nature, an order, or the number of the components is not limited by the terminology. When a component is "linked", "coupled", or "connected" to another component, the component may be directly linked or connected to the other component. However, unless specifically stated otherwise, it should be understood that a third component may be interposed between the components which may be indirectly linked or connected.

When the position relation between two parts is described using the terms such as "on", "above", "below", and "next", one or more parts may be positioned between the two parts unless the terms are used with the term "immediately" or "directly".

Although the terms "first", "second", and the like are used for describing various components, these components are not confined by these terms. These terms are merely used for distinguishing one component from the other components. Therefore, a first component to be mentioned below may be a second component in a technical concept of the present disclosure.

The features of various aspects of the present disclosure may be partially or entirely adhered to or combined with each other and may be interlocked and operated in technically various ways, and the aspects may be carried out independently of or in association with each other.

The following aspects will be described focusing on the organic light emitting display apparatus. However, aspects of the present disclosure are not limited to organic light emitting display apparatus and may be applied to various electroluminescent displays. For example, the electroluminescent display apparatus may use an organic light emitting diode (OLED) display apparatus, a quantum dot light emitting diode display apparatus, or an inorganic light emitting diode display apparatus.

Hereinafter, exemplary aspects of the present disclosure will be described in detail with reference to accompanying drawings.

FIG. 1 is a view illustrating an example of a display apparatus according to an aspect of the present disclosure.

In the aspect, a display apparatus 100 may be disposed on at least a part of a dashboard of a vehicle. The dashboard of the vehicle includes a configuration disposed at a front side of a front seat (e.g., a driver seat or a passenger seat) of the vehicle. For example, the dashboard of the vehicle may be equipped with an input configuration for manipulating various functions (e.g., an air conditioner, an audio system, and a navigation system) in the vehicle.

In the aspect, the display apparatus 100 may be disposed on the dashboard of the vehicle and operate as an input part for manipulating at least some of various functions of the vehicle. The display apparatus 100 may provide various types of information related to the vehicle, e. g., driving information of the vehicle (e. g., a current speed of the vehicle, a remaining fuel amount, and a traveling distance), and information on components of the vehicle (e. g., a degree of damage to a vehicle tire).

In the aspect, the display apparatus 100 may be disposed to traverse the driver seat and the passenger seat disposed as the front seat of the vehicle. Users of the display apparatus 100 may include a driver of the vehicle, and a fellow passenger seated in the passenger seat. Both the driver and the fellow passenger in the vehicle may use the display apparatus 100.

In the aspect, only a part of the display apparatus 100 may be illustrated in FIG. 1. The display apparatus 100 illustrated in FIG. 1 may be illustrated as a display panel among various components included in the display apparatus 100. For example, the display apparatus 100 illustrated in FIG. 6 may be illustrated as at least a part of a display area and at least a part of a non-display area of the display panel. The components, which exclude the components illustrated in FIG. 1 among the components of the display apparatus 100, may be mounted in the vehicle (or at least a part of the vehicle).

Figure 2:
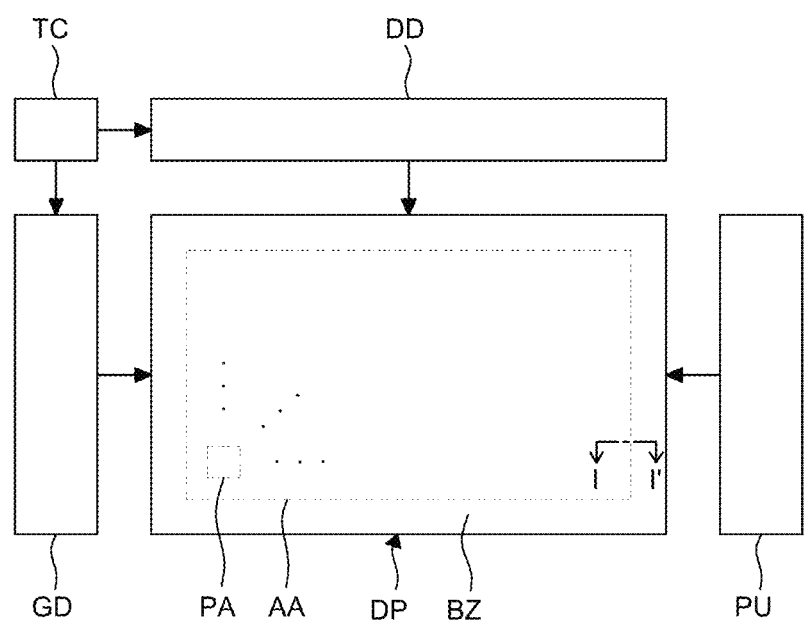
FIG. 2 is a functional block diagram of the display apparatus according to the aspect of the present disclosure.

FIG. 2 is a functional block diagram of the display apparatus according to the aspect of the present disclosure.

An electroluminescent display apparatus may be applied as the display apparatus according to the aspect of the present disclosure. An organic light-emitting diode display apparatus, a quantum-dot light-emitting diode display apparatus, or an inorganic light-emitting diode display apparatus may be used as the electroluminescent display apparatus.

With reference to FIG. 2, the display apparatus may include a display panel DP, a data driver (or data drive circuit) DD, a gate driver (or gate drive circuit) GD, a timing controller TC, and a power source unit PU.

In the aspect, the display panel DP may create an image to be provided to the user. For example, the display panel DP may create and display an image, which is to be provided to the user, through a pixel area PA in which a pixel circuit is disposed.

The data driver DD, the gate driver GD, the timing controller TC, and the power source unit PU may provide signals for operating the pixel areas PA through signal lines. For example, the signal lines may include data lines DL, gate lines GL, and power voltage supply lines PL illustrated in FIG. 3.

Figure 3:
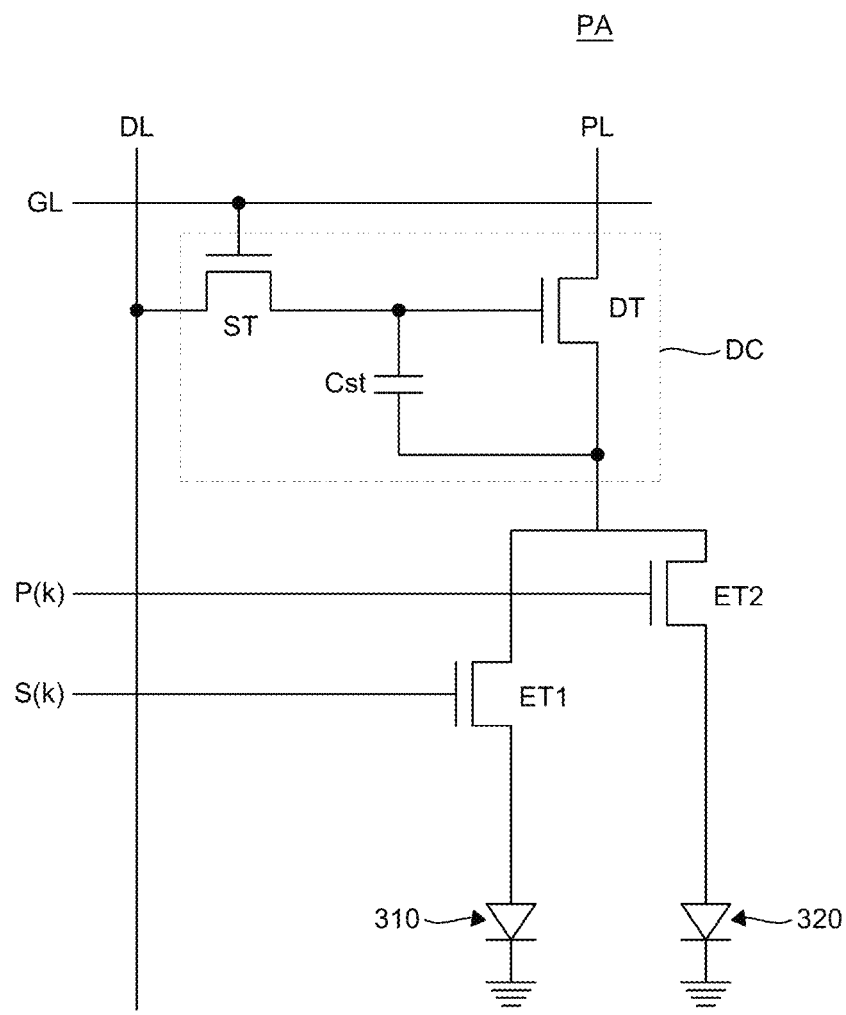
FIG. 3 is a view illustrating an example of a pixel circuit of the display apparatus according to the aspect of the present disclosure.

For example, the data driver DD may apply data signals to the pixel areas PA through the data lines DL in FIG. 3, the gate driver GD may apply gate signals to the pixel areas PA through the gate lines GL, and the power source unit PU may apply power voltages to the pixel areas PA through the power voltage supply lines PL.

The timing controller TC may control the data driver DD and the gate driver GD. For example, the timing controller TC may realign digital video data, which are inputted from the outside, to fit the resolution of the display panel DP and supply the video data to the data driver DD.

The data driver DD may convert digital video data, which are inputted from the timing controller TC, into analog data voltages in response to the data control signal and supply the analog data voltages to the plurality of data lines.

The gate driver GD may generate a scan signal and a light-emitting signal (or light emission control signal) in response to the gate control signal. The gate driver GD may include a scan drive part and a light-emitting signal drive part. The scan drive part may generate scan signals in a row-sequential manner to operate at least one scan line connected to each pixel row and supply the scan signals to scan lines. The light-emitting signal drive part may generate light-emitting signals in a row-sequential manner to operate at least one light-emitting signal line connected to each pixel row and supply the light-emitting signals to light-emitting signal lines.

The gate driver (or gate drive circuit) GD may generate a plurality of scan signals and a light-emitting signal. For example, the gate driver GD may generate a first scan signal (e.g., a first scan signal Scan(N) in FIG. 7), a second scan signal (e.g., a second scan signal Scan(N−1) in FIG. 7), and a light-emitting signal (e.g., a light-emitting signal EM(N) in FIG. 7).

According to the aspect, the gate driver GD may be disposed on the display panel DP in a gate-driver-in-panel (GIP) manner. For example, the gate driver GD may be divided into a plurality of gate drivers and respectively disposed on at least two side surfaces of the display panel DP.

A display area AA of the display panel DP may include a plurality of pixel areas (or pixels or pixel circuits) PA. In the pixel areas PA, the plurality of data lines (e.g., the data lines DL in FIG. 3) and the plurality of gate lines (e.g., the gate lines GL in FIG. 3) intersect, and subpixels may be disposed in each intersection area. The subpixels included in one pixel area PA may emit light with different colors. For example, the pixel area PA may implement blue, red, and green by using three subpixels. However, the present disclosure is not limited thereto. In some instances, the pixel area PA may further include a subpixel for further implementing a particular color (e.g., white).

In the pixel area PA, the area for implementing blue may be referred to as a blue subpixel area, an area for implementing red may be referred to as a red subpixel area, and an area for implementing green may be referred to as a green subpixel area.

In the aspect, the pixel area PA may include a plurality of subpixels. The plurality of subpixels may each be divided into first and second lens areas that provide different viewing angles. For example, the pixel area PA may include a first lens area configured to define a first viewing angle by providing light within a first range, and a second lens area configured to define a second viewing angle by providing light within a second range. The first range may be a range larger than the second range.

A non-display area BZ may be disposed along a periphery of the display area AA. Various constituent elements for operating the pixel circuit disposed in the pixel area PA may be disposed in the non-display area BZ. For example, at least a part of the gate drive circuit GD may be disposed in the non-display area BZ. The non-display area BZ may be referred to as a bezel area.

FIG. 3 illustrates an example of the pixel circuit of the display apparatus according to the aspect of the present disclosure. The pixel area PA may include the plurality of subpixels for implementing different colors, and the pixel circuits respectively corresponding to the plurality of subpixels. FIG. 3 illustrates an example of the pixel circuit of one subpixel disposed in the pixel area PA.

With reference to FIG. 3, the pixel circuit may include a plurality of transistors DT, ST, ET1, and ET2, a capacitor Cst, and a plurality of light-emitting elements 310 and 320.

A driving transistor DT and the capacitor Cst may be connected to a switching transistor ST. A first electrode of the driving transistor DT may be connected to the power voltage supply line PL.

The switching transistor ST may be connected to the gate line GL and supplied with the gate signal. The switching transistor ST may be turned on or off by the gate signal. The first electrode of the switching transistor ST may be connected to the data line DL. A second electrode of the switching transistor ST may be connected to a gate electrode of the driving transistor DT. In this case, the data signal may be supplied to the gate electrode of the driving transistor DT through the switching transistor ST on the basis that the switching transistor ST is turned on.

The capacitor Cst may be disposed between a gate electrode and the second electrode of the driving transistor DT. The capacitor Cst may maintain a signal applied to the gate electrode of the driving transistor DT, for example, maintain the data signal for one frame.

According to the aspect, the driving transistor DT, the switching transistor ST, and the capacitor Cst may be constituent elements for operating light-emitting operations of the light-emitting elements (e. g., a first light-emitting element 310 and a second light-emitting element 320) and referred to as a drive part DC. However, the present disclosure is not limited by these terms.

The first light-emitting element 310 may be connected to a first transistor ET1 that is turned on or off by a first control signal S(k). The second light-emitting element 320 may be connected to a second transistor ET2 that is turned on or off by a second control signal P(k). The first control signal S(k) and the second control signal P(k) are generated by a mode controller that may be included in the data driver DD shown in FIG. 2.

In this case, the first light-emitting element 310 or the second light-emitting element 320 may be connected to other components of the pixel circuit, e.g., the driving transistor DT in accordance with a mode. The mode may be determined in case that a condition, which is designated by a user's input or designated in advance, is satisfied. For example, in case that a predesignated first condition is satisfied, the first light-emitting element 310 emits light based on the supply of the first control signal S(k). In case that a predesignated second condition is satisfied, the second light-emitting element 320 may emit light based on the supply of the second control signal P(k). The first condition may include a predesignated condition for an operation to a first mode. The second condition may include a predesignated condition for an operation to a second mode.

The plurality of transistors DT, ST, ET1, and ET2 in FIG. 3 may include at least one of oxide semiconductors such as amorphous silicon, polycrystalline silicon, and IGZO. The first or second electrode of the transistor may be a source electrode or a drain electrode. For example, the first electrode may be a source electrode, or the second electrode may be a drain electrode. As another example, the first electrode may be a drain electrode, and the second electrode may be a source electrode.

Figure 4:
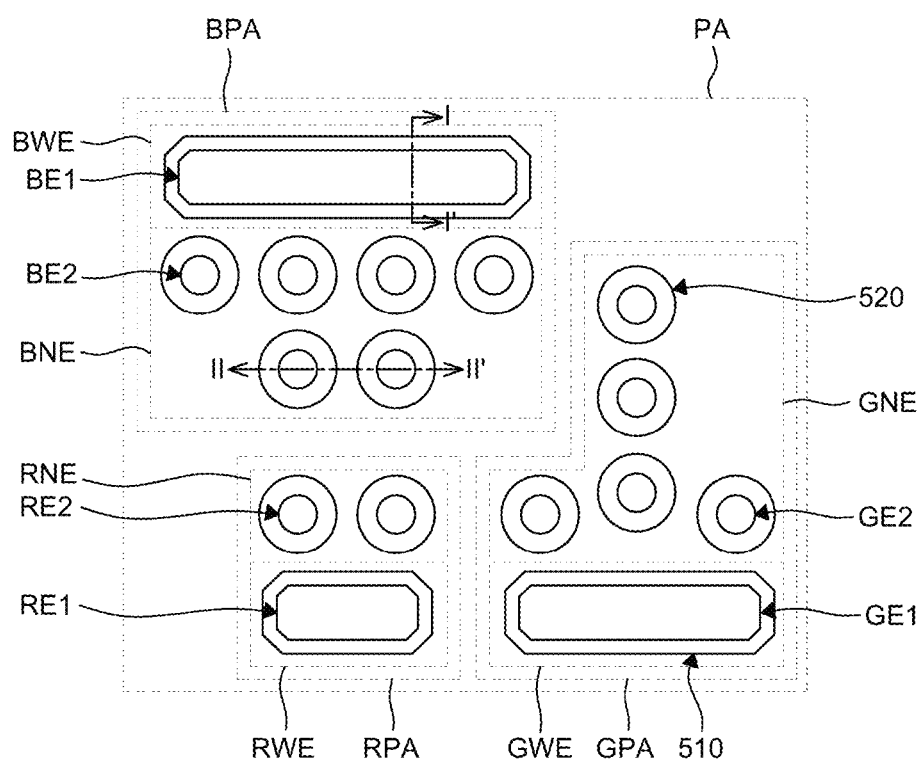
FIG. 4 is a view illustrating an example of the arrangement of lenses included in the display apparatus according to the aspect of the present disclosure.
Figure 5:
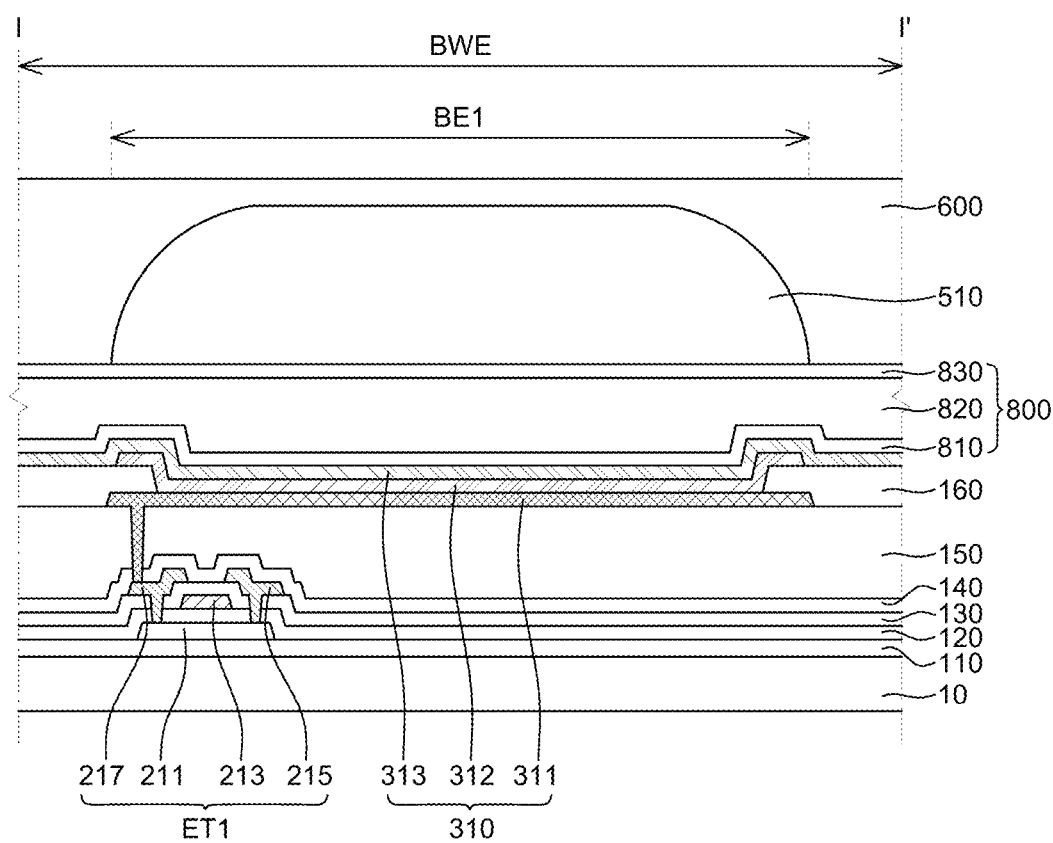
FIG. 5 is a view illustrating an example of a cross-section taken along line I-I' in FIG. 4.
Figure 6:
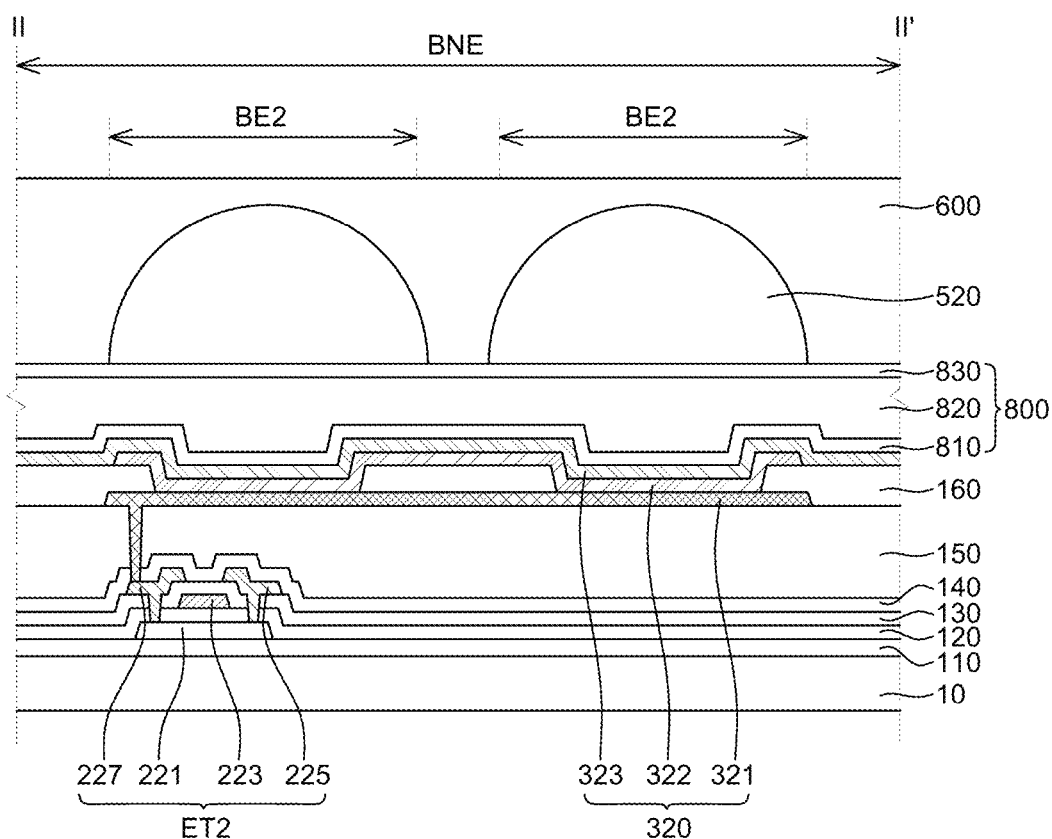
FIG. 6 is a view illustrating an example of a cross-section taken along line II-II' in FIG. 4.

FIG. 4 illustrates a planar surface of a part of the display apparatus according to the aspect of the present disclosure. FIG. 4 illustrates a planar surface of the pixel area PA in case that three subpixels are disposed in the pixel area PA. FIG. 5 illustrates a cross-section taken along line I-I' in FIG. 4, and FIG. 6 illustrates a cross-section taken along line II-II' in FIG. 4. Hereinafter, the present disclosure will be described with reference to FIGS. 4 to 6.

In FIG. 4, the pixel area PA may include a blue subpixel area BPA configured to implement blue, a red subpixel area RPA configured to implement red, and a green subpixel area GPA configured to implement green. According to the aspect, the blue subpixel area BPA may correspond to a first subpixel, the red subpixel area RPA may correspond to a second subpixel, and the green subpixel area GPA may correspond to a third subpixel. The pixel circuit may correspond to each of the subpixels. The pixel circuit may be disposed to correspond each of the subpixels.

The pixel area PA may include first lens areas BWE, RWE, and GWE and second lens areas BNE, RNE, and GNE that provide different viewing angles. The second lens areas BNE, RNE, and GNE in each of the pixel areas PA may operate independently of the first lens areas BWE, RWE, and GWE in the corresponding pixel area PA. For example, the pixel areas PA may each include the first light-emitting elements 310 (e.g., the first light-emitting elements 310 shown in FIG. 2) positioned in the first lens areas BWE, RWE, and GWE in the corresponding pixel area PA, and the second light-emitting elements 320 (e.g., the second light-emitting elements 320 shown in FIG. 2) positioned in the second lens areas BNE, RNE, and GNE in the corresponding pixel area PA.

The first light-emitting element 310 may emit light with a particular color. For example, the first light-emitting element 310 may include a first lower electrode 311, a first light-emitting layer 312, and a first upper electrode 313 sequentially stacked on a substrate 10. The substrate 10 may include an insulating material. The substrate 10 may include a transparent material. For example, the substrate 10 may include glass or plastic.

The first lower electrode 311 may include an electrically conductive material. The first lower electrode 311 may include a material having high reflectance. For example, the first lower electrode 311 may include metal such as aluminum (Al) and silver (Ag). The first lower electrode 311 may have a multilayer structure. For example, the first lower electrode 311 may have a structure in which a reflective electrode, which is made of metal, is positioned between transparent electrodes made of a transparent conductive material such as ITO and IZO.

The first light-emitting layer 312 may create light with brightness corresponding to a voltage difference between the first lower electrode 311 and the first upper electrode 313. For example, the first light-emitting layer 312 may include an emission material layer (EML) including a light-emitting material. The light-emitting material may include an organic material, an inorganic material, or a hybrid material.

The first light-emitting layer 312 may have a multilayer structure. For example, the first light-emitting layer 312 may further include at least one of a hole injection layer (HIL), a hole transport layer (HTL), an electron transport layer (ETL), and an electron injection layer (EIL).

The first upper electrode 313 may include an electrically conductive material. The first upper electrode 313 may include a material different from the material of the first lower electrode 311. A transmittance rate of the first upper electrode 313 may be higher than a transmittance rate of the first lower electrode 311. For example, the first upper electrode 313 may be configured as a transparent electrode made of a transparent conductive material such as ITO and IZO. Therefore, in the display apparatus according to the aspect of the present disclosure, the light created by the first light-emitting layer 312 may be discharged through the first upper electrode 313.

The second light-emitting element 320 may implement the same color as the first light-emitting element 310. The second light-emitting element 320 may have the same structure as the first light-emitting element 310. For example, the second light-emitting element 320 may include a second lower electrode 321, a second light-emitting layer 322, and a second upper electrode 323 sequentially stacked on the substrate 10.

The second lower electrode 321 may correspond to the first lower electrode 311, the second light-emitting layer 322 may correspond to the first light-emitting layer 312, and the second upper electrode 323 may correspond to the first upper electrode 313. For example, the second lower electrode 321 may be formed for the second light-emitting element 320 while having the same structure as the first lower electrode 311. The same may apply to the second light-emitting layer 322 and the second upper electrode 323. For example, the first light-emitting element 310 and the second light-emitting element 320 may be formed to have the same structure. However, the present disclosure is not limited thereto. In some instances, the first light-emitting element 310 and the second light-emitting element 320 may be formed to be different from each other in at least some configurations.

In the aspect, the second light-emitting layer 322 may be spaced apart from the first light-emitting layer 312. Therefore, in the display apparatus according to the aspect of the present disclosure, it is possible to suppress light emission caused by a leakage current.

According to the aspect of the present disclosure, in the display apparatus, only one of the first light-emitting layer 312 and the second light-emitting layer 322 may create light in accordance with the user's selection or a predesignated condition.

In the aspect, the first light-emitting element 310 and the second light-emitting element 320 in the pixel area PA may be positioned on a drive part (e. g., a drive part DC in FIG. 3) in the corresponding pixel area PA. For example, at least one insulation film (e. g., an element buffer film 110, a gate insulation film 120, an interlayer insulation film 130, a lower protective film 140, and an overcoating layer 150) may be positioned on the substrate 10, and the first light-emitting element 310 and the second light-emitting element 320 in each of the pixel areas PA may be disposed on one of the insulation films. Therefore, in the display apparatus according to the aspect of the present disclosure, the first light-emitting element 310 and the second light-emitting element 320 in each of the pixel areas PA may be inhibited from being unnecessarily connected to the drive part DC of the corresponding pixel area PA.

In the aspect, the buffer film 110, the gate insulation film 120, the interlayer insulation film 130, the lower protective film 140, and the overcoating layer 150 may be stacked on the substrate 10. The buffer film 110 may include an insulating material. For example, the buffer film 110 may include an inorganic insulating material such as silicon oxide (SiOx) and silicon nitride (SiNx). The buffer film 110 may have a multilayer structure. For example, the buffer film 110 may have a stacked structure including a film made of silicon nitride (SiNx) and a film made of silicon oxide (SiOx).

In the aspect, the buffer film 110 may be positioned between the element substrate 10 and the drive part DC in each of the pixel areas PA. The buffer film 110 may suppress the contamination caused by the substrate 10 during the process of forming the drive part DC. For example, a top surface of the substrate 10, which is directed toward the drive part DC in each of the pixel areas PA, may be covered by the buffer film 110. The drive part DC may be positioned on the buffer film 110 in each of the pixel areas PA.

In the aspect, the gate insulation film 120 may include an insulating material. For example, the gate insulation film 120 may include an inorganic insulating material such as silicon oxide (SiO) and silicon nitride (SiN). The gate insulation film 120 may include a material having high permittivity. For example, the gate insulation film 120 may include a high-K material such as hafnium oxide (HfO). The gate insulation film 120 may have a multilayer structure.

The gate insulation film 120 may be positioned on the buffer film 110. The gate insulation film 120 may extend between the semiconductor layer and the gate electrode of the transistor. For example, the gate electrodes of the switching transistor ST and the driving transistor DT may be insulated from the semiconductor layers of the switching transistor ST and the driving transistor DT by the gate insulation film 120. The gate insulation film 120 may cover first and second semiconductor layers in each of the pixel areas PA. The gate electrodes of the switching transistor ST and the driving transistor DT may be positioned on the gate insulation film 120.

The interlayer insulation film 130 may include an insulating material. For example, the interlayer insulation film 130 may include an inorganic insulating material such as silicon oxide (SiO) and silicon nitride (SiN). The interlayer insulation film 130 may be positioned on the gate insulation film 120. The interlayer insulation film 130 may extend between the gate electrodes and the source electrodes and between the gate electrodes and the drain electrodes of the driving transistor DT and the switching transistor ST. For example, the source electrodes and the drain electrodes of the driving transistor DT and the switching transistor ST may be insulated from the gate electrodes by the interlayer insulation film 130. The interlayer insulation film 130 may cover the gate electrodes of the switching transistor ST and the driving transistor DT. The source electrode and the drain electrode in each of the pixel areas PA may be positioned on the interlayer insulation film 130. The gate insulation film 120 and the interlayer insulation film 130 may expose source and drain areas of each semiconductor pattern positioned in each of the pixel areas PA.

In the aspect, the lower protective film 140 may include an insulating material. For example, the lower protective film 140 may include an inorganic insulating material such as silicon oxide (SiO) and silicon nitride (SiN). The lower protective film 140 may be positioned on the interlayer insulation film 130. The lower protective film 140 may suppress damage to the drive part DC caused by external moisture and impact. The lower protective film 140 may extend along a surface of the driving transistor DT and a surface of the switching transistor ST that are opposite to the substrate 10. The lower protective film 140 may be in contact with the interlayer insulation film 130 outside the drive part DC positioned in each of the pixel areas PA.

The overcoating layer 150 may include an insulating material. The overcoating layer 150 may include a material different from the material of the lower protective film 140. For example, the overcoating layer 150 may include an organic insulating material. The overcoating layer 150 may be positioned on the lower protective film 140. The overcoating layer 150 may remove a level difference caused by the drive part 205 in each of the pixel areas PA. For example, a top surface of the overcoating layer 150, which is opposite to the element substrate 10, may be a flat surface.

In the aspect, the first transistor ET1 may be electrically connected between the drain electrode of the driving transistor DT and the first lower electrode 311 of the first light-emitting element 310. The second transistor ET2 may be electrically connected between the drain electrode of the driving transistor DT and the second lower electrode 321 of the second light-emitting element 320.

The first transistor ET1 may include a first semiconductor layer 211, a first gate electrode 213, a first source electrode 215, and a first drain electrode 217. A first transistor T1 may have the same structure as the switching transistor ST and the driving transistor DT. For example, the first semiconductor layer 211 may be positioned between the buffer film 110 and the gate insulation film 120, and the first gate electrode 213 may be positioned between the gate insulation film 120 and the interlayer insulation film 130. The first source electrode 215 and the first drain electrode 217 may be positioned between the interlayer insulation film 130 and the lower protective film 140. The first gate electrode 213 may overlap a channel area of the first semiconductor layer 211. The first source electrode 215 may be electrically connected to a source area of the first semiconductor layer 211. The first drain electrode 217 may be electrically connected to a drain area of the first semiconductor layer 211.

In the aspect, the second transistor ET2 may include a second semiconductor layer 221, a second gate electrode 223, a second source electrode 225, and a second drain electrode 227. For example, the second semiconductor layer 221 may be positioned on the same layer as the first semiconductor layer 211, the second gate electrode 223 may be positioned on the same layer as the first gate electrode 213, and the second source electrode 225 and the second drain electrode 227 may be positioned on the same layer as the first source electrode 215 and the first drain electrode 217.

In the aspect, the first transistor ET1 may be formed simultaneously with the switching transistor ST and the driving transistor DT. The first transistor ET1 may be formed simultaneously with the second transistor ET2.

The first light-emitting element 310 and the second light-emitting element 320 in each of the pixel areas PA may be positioned on the overcoating layer 150 in the corresponding pixel area PA. For example, the first lower electrode 311 of the first light-emitting element 310 may be electrically connected to the first drain electrode 217 (or the first source electrode 215) of the first transistor ET1 through contact holes formed through the lower protective film 140 and the overcoating layer 150, and the second lower electrode 321 of the second light-emitting element 320 may be electrically connected to the second drain electrode 227 (or the second source electrode 225) of the second transistor ET2 through contact holes formed through the lower protective film 140 and the overcoating layer 150.

The second lower electrode 321 in each of the pixel areas PA may be spaced apart from the first lower electrode 311 in the corresponding pixel area PA. For example, a bank insulation film 160 may be positioned between the first lower electrode 311 and the second lower electrode 321 in each of the pixel areas PA. The bank insulation film 160 may include an insulating material. For example, the bank insulation film 160 may include an organic insulating material. The bank insulation film 160 may include a material different from the material of the overcoating layer 150.

The second lower electrode 321 in each of the pixel areas PA may be insulated from the first lower electrode 311 in the corresponding pixel area PA by the bank insulation film 160. For example, the bank insulation film 160 may cover an edge of the first lower electrode 311 and an edge of the second lower electrode 321 positioned in each of the pixel areas PA. Therefore, the display apparatus may provide the user with images made by the first lens areas BWE, RWE, and GWE in each of the pixel areas PA in which the first light-emitting element 310 is positioned or images made by the second lens areas BNE, RNE, and GNE in each of the pixel areas PA in which the second light-emitting element 320 is positioned.

The first light-emitting layer 312 and the first upper electrode 313 of the first light-emitting element 310, which is positioned in each of the pixel areas PA, may be stacked in a partial area of the corresponding first lower electrode 311 exposed by the bank insulation film 160. The second light-emitting layer 322 and the second upper electrode 323 of the second light-emitting element 320, which is positioned in each of the pixel areas PA, may be stacked in a partial area of the corresponding second lower electrode 321 exposed by the bank insulation film 160. For example, in each of the pixel areas PA, the bank insulation film 160 may be divided into first light-emitting areas BE1, RE1, and GE1 in which light is emitted by the first light-emitting element 310, and second light-emitting areas BE2, RE2, and GE2 in which light is emitted by the second light-emitting element 320. In each of the pixel areas PA, a size of each of the second light-emitting areas BE2, RE2, and GE2 may be smaller than a size of each of the first light-emitting areas BE1, RE1, and GE1.

In each of the pixel areas PA, the second upper electrode 323 may be electrically connected to the first upper electrode 313 in the corresponding pixel area PA. For example, a voltage, which is applied to the second upper electrode 323 of the second light-emitting element 320 positioned in each of the pixel areas PA, may be equal to a voltage applied to the first upper electrode 313 of the first light-emitting element 310 positioned in the corresponding pixel area PA. The second upper electrode 323 in each of the pixel areas PA may include the same material as the first upper electrode 313 in the corresponding pixel area PA. For example, the second upper electrode 323 in each of the pixel areas PA may be formed simultaneously with the first upper electrode 313 in the corresponding pixel area PA. The second upper electrode 323 in each of the pixel areas PA may extend on the bank insulation film 160 and be in direct contact with the first upper electrode 313 in the corresponding pixel area PA. The brightness in the first lens areas BWE, RWE, and GWE positioned in each of the pixel areas PA and the brightness in the second lens areas BNE, RNE, and GNE may be controlled by a drive current generated in the corresponding pixel area PA.

An encapsulation member 800 may be positioned on the first light-emitting element 310 and the second light-emitting element 320 in each of the pixel areas PA. The encapsulation member 800 may suppress damage to the light-emitting elements 310 and 320 caused by moisture and impact from the outside. The encapsulation member 800 may have a multilayer structure. For example, the encapsulation member 800 may include a first encapsulation layer 810, a second encapsulation layer 820, and a third encapsulation layer 830 sequentially stacked. However, the aspects of the present disclosure are not limited thereto. For example, the encapsulation member 800 may include a first encapsulation layer 810, a second encapsulation layer 820, and a third encapsulation layer 830 sequentially stacked. However, the aspects of the present disclosure are not limited thereto. The second encapsulation layer 820 may include a material different from the material of the first encapsulation layer 810 and the third encapsulation layer 830. For example, the first encapsulation layer 810 and the third encapsulation layer 830 are inorganic encapsulation layers including an inorganic insulating material, and the second encapsulation layer 820 may include an organic encapsulation layer including an organic insulating material. Therefore, damage to the light-emitting elements 310 and 320 of the display apparatus caused by moisture and impact from the outside may be more effectively suppressed.

First lenses 510 and second lenses 520 may be positioned on the encapsulation member 800 in each of the pixel areas PA.

The first lenses 510 may be positioned on the first lens areas BWE, RWE, and GWE in each of the pixel areas PA. For example, the light, which is created by the first light-emitting element 310 in each of the pixel areas PA, may be discharged through the first lens 510 in the corresponding pixel area PA. The first lens 510 may have a shape in which at least light in one direction may not be restricted. For example, a planar shape of the first lens 510 positioned in each of the pixel areas PA may be a bar shape extending in a first direction.

In this case, the propagation direction of the light emitted from the first lens areas BWE, RWE, and GWE in the pixel area PA is not limited to the first direction. For example, the content (or images) provided through the first lens areas BWE, RWE, and GWE in the pixel area PA may be shared with surrounding people adjacent to the user in the first direction. The case in which the content is provided through the first lens areas BWE, RWE, and GWE is a mode in which the content is provided within a first viewing angle range larger than a second viewing angle range in which the second lens areas BNE, RNE, and GNE are provided, and this mode may be referred to as a first mode.

The second lenses 520 may be positioned on the second lens areas BNE, RNE, and GNE in each of the pixel areas PA. The light, which is created by the second light-emitting element 320 in the pixel area PA, may be discharged through the second lens 520 in the corresponding pixel area PA. The second lens 520 may restrict the propagation direction, in which light passes through the second lens 520, to the first direction and/or the second direction. For example, a planar shape of the second lens 520 positioned in the pixel area PA may be a circular shape. In this case, the propagation direction of the light emitted from the second lens areas BNE, RNE, and GNE in the pixel area PA may be restricted to the first and second directions. For example, the content provided by the second lens areas BNE, RNE, and GNE in the pixel area PA may not be shared with surrounding people adjacent to the user. The case in which the content is provided through the second lens areas BNE, RNE, and GNE is a mode in which the content is provided within the second viewing angle range smaller than the first viewing angle range in which the first lens areas BWE, RWE, and GWE are provided, and this mode may be referred to as a second mode.

The first light-emitting areas BE1, RE1, and GE1 included in the first lens areas BWE, RWE, and GWE in each of the pixel areas PA may have shapes corresponding to the first lenses 510 positioned in the first lens areas BWE, RWE, and GWE in the corresponding pixel area PA. For example, planar shapes of the first light-emitting areas BE1, RE1, and GE1 defined in the first lens areas BWE, RWE, and GWE in each of the pixel areas PA may each be a bar shape extending in the first direction. The first lenses 510 positioned in the first lens areas BWE, RWE, and GWE in the pixel area PA may have sizes larger than those of the first light-emitting areas BE1, RE1, and GE1 included in the first lens areas BWE, RWE, and GWE in the corresponding pixel area PA. Therefore, it is possible to improve the efficiency of the light emitted from the first light-emitting areas BE1, RE1, and GE1 in the pixel area PA.

The second light-emitting areas BE2, RE2, and GE2 included in the second lens areas BNE, RNE, and GNE in each of the pixel areas PA may have shapes corresponding to the second lenses 520 positioned in the second lens areas BNE, RNE, and GNE in the corresponding pixel area PA. For example, planar shapes of the second light-emitting areas BE2, RE2, and GE2 included in the second lens areas BNE, RNE, and GNE in the pixel area PA may each be a circular shape. The second lenses 520 positioned in the second lens areas BNE, RNE, and GNE in the pixel area PA may have sizes larger than those of the second light-emitting areas BE2, RE2, and GE2 included in the second lens areas BNE, RNE, and GNE in the corresponding pixel area PA. For example, planar shapes of the second light-emitting areas BE2, RE2, and GE2 positioned in the second lens areas BNE, RNE, and GNE in each of the pixel areas PA may be circular shapes concentric to planar shapes of the second lenses 520 positioned in the second lens areas BNE, RNE, and GNE in the corresponding pixel area PA. In this case, it is possible to improve the efficiency of the light emitted from the second light-emitting areas BE2, RE2, and GE2 in the pixel area PA.

In the aspect, the first lens area BWE, RWE, or GWE in the pixel area PA may include one first light-emitting area BE1, RE1, or GE1. The second lens areas BNE, RNE, and GNE in the pixel area PA may include the plurality of second light-emitting areas BE2, RE2, and GE2.

In the aspect, one first lens 510 may be disposed in the first lens area BWE, RWE, or GWE in the pixel area PA. The plurality of second lenses 520 may be disposed in the second lens areas BNE, RNE, and GNE in the pixel area PA.

In the aspect, the second light-emitting areas BE2, RE2, and GE2 included in the second lens areas BNE, RNE, and GNE in the pixel area PA may operate for the respective subpixel areas. The second light-emitting areas (e. g., the second light-emitting areas BE2, the second light-emitting areas RE2, or the second light-emitting areas GE2) included in one subpixel area may operate simultaneously.

In the aspect, one second lower electrode 321 may be positioned in the second lens area BNE, RNE, or GNE in each of the pixel areas PA. The bank insulation film 160 between the second light-emitting areas BE2, RE2, and GE2 may be positioned between the second lower electrode 321 and the second light-emitting layer 322. The bank insulation film 160, which is disposed between the second light-emitting areas BE2, between the second light-emitting areas RE2, and/or between the second light-emitting areas GE2, may be positioned between the second lower electrode 321 and the second light-emitting layer 322. The second light-emitting layer 322, which is disposed between the second light-emitting areas BE2, RE2, and GE2 in the second lens areas BNE, RNE, and GNE, may be spaced apart from the second lower electrode 321 by the bank insulation film 160. In this case, it is possible to improve the luminous efficiency of the second light-emitting areas BE2, RE2, and GE2.

In the aspect, areas of the second light-emitting areas BE2, RE2, and GE2 positioned in the second lens areas BNE, RNE, and GNE in the pixel area PA may be designated as particular values. For example, the areas of the second light-emitting areas BE2, RE2, and GE2 positioned in the second lens areas BNE, RNE, and GNE may be implemented to be equal to one another. The area of each of the second light-emitting areas BE2, RE2, and GE2 positioned in the second lens areas BNE, RNE, and GNE in the pixel area PA may be equal to the area of each of the second light-emitting areas BE2, RE2, and GE2 included in the second lens areas BNE, RNE, and GNE in the adjacent pixel area PA.

In the aspect, the number of second light-emitting areas may vary depending on the subpixel areas RPA, GPA, and BPA. For example, the number of second light-emitting areas BE2 defined in the second lens area BNE in the blue subpixel area BPA may be larger than the number of second light-emitting areas RE2 defined in the second lens area RNE in the red subpixel area RPA. The number of second light-emitting areas RE2 defined in the second lens area RNE in the red subpixel area RPA may be larger than the number of second light-emitting areas GE2 defined in the second lens area GNE in the green subpixel area GPA. In this case, the efficiency deviation between the second light-emitting elements 320 positioned in the second lens areas BNE, RNE, and GNE in the pixel area PA may be compensated by the number of second light-emitting areas BE2, RE2, and GE2 defined in the second lens areas BNE, RNE, and GNE in each of the pixel areas PA.

In the aspect, the sizes of the first light-emitting areas BE1, RE1, and GE1 may be different from one another for the respective subpixel areas RPA, GPA, and BPA. For example, the first light-emitting area BE1 in the blue subpixel area BPA may have a different size from the first light-emitting area RE1 in the red subpixel area RPA and have a different size from first light-emitting area GE1 in the green subpixel area GPA. The size of the first light-emitting area BE1 in the blue subpixel area BPA may be larger than the size of the first light-emitting area RE1 in the red subpixel area RPA. The size of the first light-emitting area RE1 in the red subpixel area RPA may be larger than the size of the first light-emitting area GE1 in the green subpixel area GPA. Therefore, in the display apparatus according to the aspect of the present disclosure, the efficiency deviation between the first light-emitting elements 310 positioned in the first lens areas BWE, RWE, and GWE in each of the pixel areas PA may be compensated by the sizes of the first light-emitting areas BE1, RE1, and GE1 defined in the first lens areas BWE, RWE, and GWE in each of the pixel areas PA.

In the aspect, a lens protective film 600 may be positioned on the first lens 510 and the second lens 520 in the pixel area PA. The lens protective film 600 may include an insulating material. For example, the lens protective film 600 may include an organic insulating material. A refractive index of the lens protective film 600 may be smaller than a refractive index of the first lens 510 and a refractive index of the second lens 520 positioned in each of the pixel areas PA. Therefore, in the display apparatus according to the aspect of the present disclosure, the light, which has passed through the first lens 510 and the second lens 520 in each of the pixel areas PA, may not be reflected toward the substrate 10 because of a difference from the refractive index of the lens protective film 600.

Figure 7:
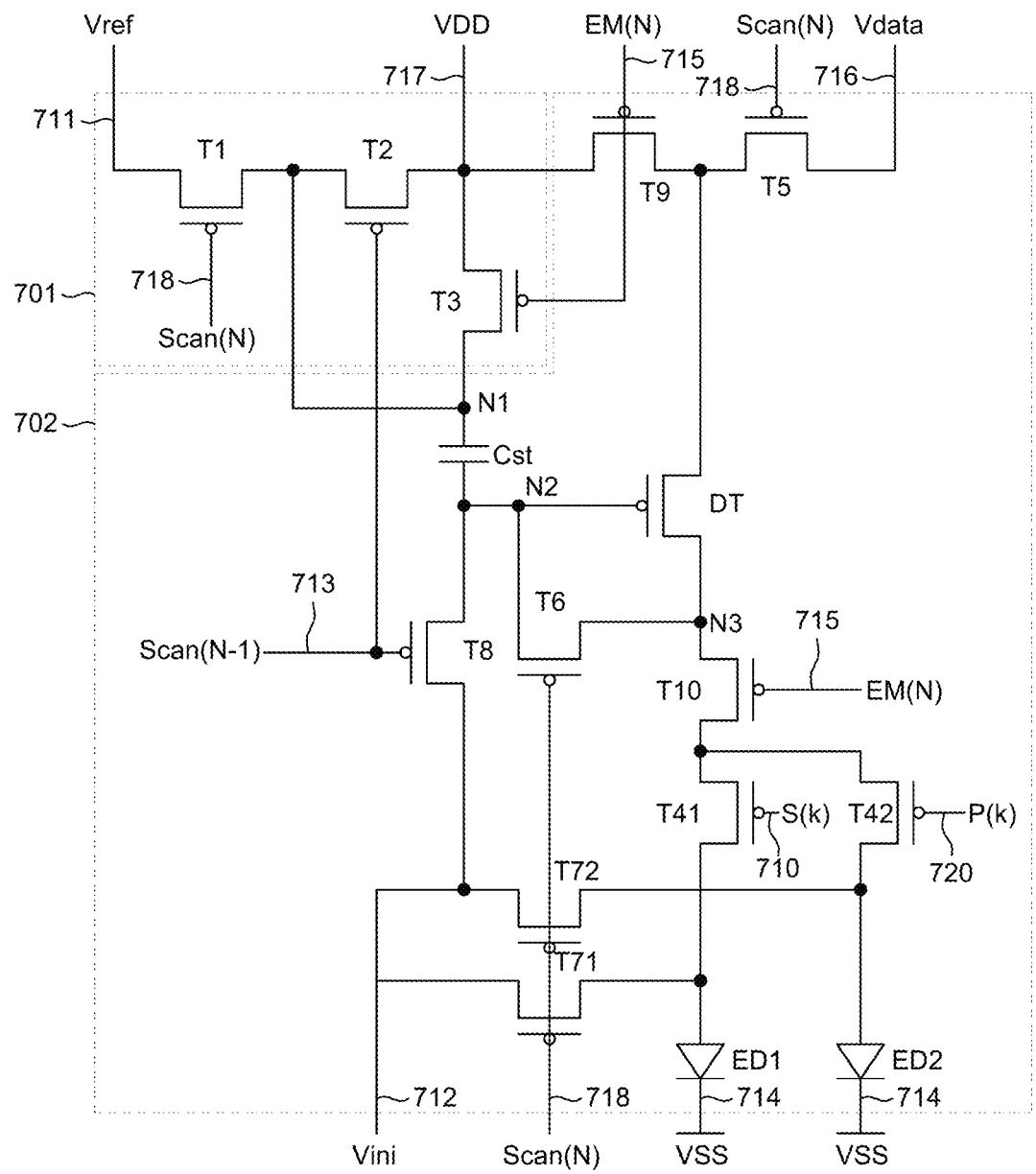
FIG. 7 is a view illustrating a shared circuit and the pixel circuit of the display apparatus according to the aspect of the present disclosure.

FIG. 7 is a view illustrating a shared circuit and the pixel circuit of the display apparatus according to the aspect of the present disclosure. FIG. 7 illustrates an example of a circuit diagram that constitutes one subpixel, and the subpixel may include a shared circuit and a pixel circuit.

With reference to FIG. 7, a shared circuit 701 and a pixel circuit 702 may be connected. In the present disclosure, for convenience of description, the shared circuit 701 and the pixel circuit 702 will be described as being distinguished from each other. However, the present disclosure is not limited thereto. According to the aspect, it will be understood that at least a part of the shared circuit 701 may include the pixel circuit 702. In addition, according to one aspect, the shared circuit 701 may be referred to as a reference voltage circuit or a reference voltage drive part, for example. However, the present disclosure is not limited by these terms.

At least a part of the shared circuit 701 may be connected to the pixel circuit 702. In addition, at least a part of the shared circuit 701 may also be connected to another pixel circuit. For example, the shared circuit 701 may be connected to at least two pixel circuits that emit light with different colors. Therefore, a reference voltage Vref may be provided to at least two pixel circuits.

At least one component included in the shared circuit 701 and the pixel circuit 702 may receive at least one of the reference voltage Vref, a high-potential voltage VDD, a low-potential voltage VSS, the light-emitting signal EM(N), a data voltage Vdata, and an initialization voltage Vini.

The reference voltage Vref may have a predesignated voltage value and be provided through a reference voltage line 711. For example, the reference voltage Vref may have a value predesignated within a range of 0 V or higher and lower than 3.5 V. The range of 0 V or higher and lower than 3.5 V may correspond to a reference voltage margin. The initialization voltage Vini may have a predesignated voltage value and be provided through an initialization voltage line 712. The initialization voltage Vini may be predesignated to have a voltage value equal to or lower than the reference voltage Vref.

The high-potential voltage VDD may have a voltage value higher than a particular value and be provided through a high-potential voltage line 717. The low-potential voltage VSS may have a voltage value lower than a particular value and be provided through a low-potential voltage line 714. The light-emitting signal EM(N) may have a voltage value at a first level or a second level and be provided through a light-emitting signal line 715. The data voltage Vdata may be designated in accordance with inputted data and provided through a data voltage line 716.

The source electrode of the transistor to be described below may be used as the drain electrode, and the drain electrode may be used as the source electrode. In addition, according to one aspect, the source electrode may be referred to as a first electrode, and the drain electrode may be referred to as a second electrode. However, the present disclosure is not limited by these terms.

In addition, hereinafter, aspects of voltages will be described by using the terms "first level" and "second level". However, the present disclosure is not limited by these terms. According to the aspect, the first level may be referred to as a high level, and the second level may be referred to as a low level. In this case, the first level may have a larger voltage value than the second level. The voltage at the first level may belong to a range of voltage values that may turn off a p-type TFT or turn on an n-type TFT. For example, the voltage at the first level may include a voltage corresponding to a range of 6 V to 16 V. The voltage at the second level may belong to a range of voltage values that may turn on the p-type TFT or turn off the n-type TFT. For example, the voltage at the second level may include a voltage corresponding to a range of −8 V to −12 V. However, the aspect of the present disclosure is not limited thereto.

The shared circuit 701 may include the first transistor T1 and/or a second transistor T2. The first transistor T1 may operate based on the first scan signal Scan(N). A first electrode of the first transistor T1 may be connected to the reference voltage line 711 that provides the reference voltage Vref. A second electrode of the first transistor T1 may be connected to at least one of the second transistor T2, a third transistor T3, and the capacitor Cst. For example, the second electrode of the first transistor T1 may be connected to the second transistor T2. In another example, the second electrode of the first transistor T1 may be connected to a first node N1 and connected to the second transistor T2, the third transistor T3, and the capacitor Cst connected to the first node N1. The first transistor T1 may provide the reference voltage Vref to the first node N1.

The second transistor T2 may be connected to the first transistor T1 in series. The second transistor T2 may operate based on the second scan signal Scan(N−1). A first electrode of the second transistor T2 may be connected to at least one of the first transistor T1, the third transistor T3, and the capacitor Cst. For example, the first electrode of the second transistor T2 may be connected to the first transistor T1, the third transistor T3, and the capacitor Cst through the first node N1. A second electrode of the second transistor T2 may be connected to at least one of the high-potential voltage line 717, the third transistor T3, and a ninth transistor T9. For example, the second electrode of the second transistor T2 may be connected to the high-potential voltage line 717 and the third transistor T3. In another example, the second electrode of the second transistor T2 may be connected to the high-potential voltage line 717, the third transistor T3, and the ninth transistor T9.

The third transistor T3 may be connected between the first node N1 and the high-potential voltage line 717. The third transistor T3 may be connected between the first electrode and the second electrode of the second transistor T2. For example, the third transistor T3 may be connected to the second transistor T2 in parallel.

In the aspect, the third transistor T3 may be connected to at least one of the second transistor T2, the high-potential voltage line 717, and the ninth transistor T9. For example, a first electrode of the third transistor T3 may be connected to at least one of the second electrode of the second transistor T2, the high-potential voltage line 717, and a first electrode of the ninth transistor T9. The third transistor T3 may be connected to the first transistor T1, the second transistor T2, and the capacitor Cst through the first node N1. For example, a second electrode of the third transistor T3 may be connected to the second electrode of the first transistor T1, the first electrode of the second transistor T2, and the capacitor Cst through the first node N1.

The first node N1 may be connected to the pixel circuit 702. In the aspect, the first node N1 may be further connected to another pixel circuit. For example, in case that the light-emitting elements (e.g., a first light-emitting element ED1 and a second light-emitting element ED2) included in the pixel circuit 702 emit light with a first color, the first node N1 may be further connected to another pixel circuit including light-emitting elements that emit light with a second color. In this case, the shared circuit 701 may be connected to the plurality of pixel circuits through the first node N1. A more specific example of the above-mentioned configuration will be described with reference to FIG. 8.

The pixel circuit 702 includes the plurality of light-emitting elements ED1 and ED2, the driving transistor DT, first to tenth transistors T1 to T10, and the capacitor Cst. The first to tenth transistors T1 to T10 may include the first transistor T1, the second transistor T2, the third transistor T3, a fourth-first transistor T41, a fourth-second transistor T42, a fifth transistor T5, a sixth transistor T6, a seventh-first transistor T71, a seventh-second transistor T72, an eighth transistor T8, the ninth transistor T9, and a tenth transistor T10.

The plurality of light-emitting elements ED1 and ED2 includes the first light-emitting element ED1 and the second light-emitting element ED2. Further, the first light-emitting element ED1 and the second light-emitting element ED2 emit light by being supplied with drive currents from the driving transistor DT. Specifically, an anode electrode of the first light-emitting element ED1 may be connected to the fourth-first transistor T41, and a cathode electrode of the first light-emitting element ED1 may be connected to an input terminal (or the low-potential voltage line 714) of the low-potential drive voltage VSS, such that the first light-emitting element ED1 may emit light by means of a first drive current. Further, an anode electrode of the second light-emitting element ED2 may be connected to the fourth-second transistor T42, and a cathode electrode of the second light-emitting element ED2 may be connected to the input terminal of the low-potential drive voltage VSS, such that the second light-emitting element ED2 may emit light by means of a second drive current.

The driving transistor DT controls the drive currents to be applied to the plurality of light-emitting elements ED1 and ED2 in response to a source-gate voltage Vgs thereof. The drive currents include the first drive current and the second drive current. In the aspect, the first electrode of the driving transistor DT may be connected to the fifth transistor T5 and the ninth transistor T9. The second electrode of the driving transistor DT may be connected to the sixth transistor T6 and the tenth transistor T10. The gate electrode of the driving transistor DT may be connected to a second node N2. The gate electrode of the driving transistor DT may be connected to a first capacitor Cst, the sixth transistor T6, and the eighth transistor T8.

The fourth-first transistor T41 may be connected to at least one of the tenth transistor T10, the fourth-second transistor T42, the seventh-first transistor T71, and the first light-emitting element ED1. In the aspect, the fourth-first transistor T41 may include a source electrode connected to the tenth transistor T10, a drain electrode connected to the anode electrode of the first light-emitting element ED1, and a gate electrode connected to a first control signal line 710 configured to provide the first control signal S (k). The fourth-first transistor T41 may be turned on or off in response to the first control signal S (k). The fourth-first transistor T41 defines a current path between the first light-emitting element ED1 and the tenth transistor T10 connected to a source electrode of the fourth-first transistor T41 in response to the first control signal S (k) at a low level, i.e., a turn-on level.

The fourth-second transistor T42 may be connected to at least one of the tenth transistor T10, the fourth-first transistor T41, the seventh-second transistor T72, and the second light-emitting element ED2. In the aspect, the fourth-second transistor T42 may include a source electrode connected to the tenth transistor T10, a drain electrode connected to the anode electrode of the second light-emitting element ED2, and a gate electrode connected to a second control signal line 720 configured to provide the second control signal P (k). The fourth-second transistor T42 may be turned on or off in response to the second control signal P (k). The fourth-second transistor T42 defines a current path between the second light-emitting element ED2 and the tenth transistor T10 connected to a source electrode of the fourth-second transistor T42 in response to the second control signal P (k) at a low level, i. e., a turn-on level.

The fifth transistor T5 may be connected to at least one of the data voltage line 716, which transmits the data voltage Vdata, the driving transistor DT, and the ninth transistor T9. The fifth transistor T5 includes a first electrode connected to the data voltage line 716, a second electrode connected to the first electrode of the driving transistor DT, and a gate electrode connected to a first scan line 718 configured to transmit the first scan signal Scan(N). The fifth transistor T5 may apply the data voltage Vdata to the first electrode of the driving transistor DT. For example, the fifth transistor T5 may apply the data voltage Vdata to the first electrode of the driving transistor DT in response to the first scan signal Scan(N) at a low level, i.e., a turn-on level.

The sixth transistor T6 diode-connects the gate electrode and the second electrode (e.g., the drain electrode) of the driving transistor DT. The sixth transistor T6 includes a first electrode connected to the second node N2, a second electrode connected to a third node N3, and a gate electrode connected to the first scan signal line 718 configured to transmit the first scan signal Scan(N). The sixth transistor T6 diode-connects the gate electrode and the drain electrode of the driving transistor DT in response to the first scan signal Scan(N) at a low level, i.e., a turn-on level.

The seventh-first transistor T71 may be connected to at least one of the initialization voltage line 712, which transmits the initialization voltage Vini, the first light-emitting element ED1, the seventh-second transistor T72, the eighth transistor T8, and the first scan signal line 718. The seventh-first transistor T71 applies the initialization voltage Vini to the anode electrode of the first light-emitting element ED1. The fourth-first transistor T41 may include a first electrode connected to an initialization voltage line 717 configured to transmit the initialization voltage Vini, a second electrode connected to the anode electrode of the first light-emitting element ED1, and a gate electrode connected to the first scan signal line 718. The seventh-first transistor T71 may apply the initialization voltage Vini to the anode electrode of the first light-emitting element ED1 in response to the first scan signal Scan(N) at a low level, i.e., a turn-on level.

The seventh-second transistor T72 may be connected to at least one of the initialization voltage line 712, the second light-emitting element ED2, the seventh-first transistor T71, the eighth transistor T8, and the first scan signal line 718. The seventh-second transistor T72 applies the initialization voltage Vini to the anode electrode of the second light-emitting element ED2. The seventh-second transistor T72 includes a first electrode connected to the initialization voltage line 712 configured to transmit the initialization voltage Vini, a second electrode connected to the anode electrode of the second light-emitting element ED2, and a gate electrode connected to the first scan signal line 718 configured to transmit the first scan signal Scan(N). The seventh-second transistor T72 applies the initialization voltage Vini to the anode electrode of the second light-emitting element ED2 in response to the first scan signal Scan(N) at a low level, i.e., a turn-on level.

The eighth transistor T8 may be connected to at least one of the initialization voltage line 712, the capacitor Cst, the second transistor T2, the sixth transistor T6, the seventh-first transistor T71, the seventh-second transistor T72, the driving transistor DT, and the first scan signal line 718. The eighth transistor T8 applies the initialization voltage Vini to the second node N2. The eighth transistor T8 includes a first electrode connected to the initialization voltage line 712 configured to transmit the initialization voltage Vini, a second electrode connected to the second node N2, and a gate electrode connected to a second scan signal line 713 configured to transmit the second scan signal Scan(N-1). The eighth transistor T8 applies the initialization voltage Vini to the anode electrode of the second node N2 in response to the second scan signal Scan(N-1) at a low level, i.e., a turn-on level.

The ninth transistor T9 may be connected to at least one of the second transistor T2, the third transistor T3, the fifth transistor T5, the driving transistor DT, the high-potential voltage line 717, and the light-emitting signal line 715 configured to provide the light-emitting signal EM(N). The ninth transistor T9 may include a first electrode connected to the high-potential voltage line 717 and the third transistor T3, a second electrode connected to the fifth transistor T5 and the driving transistor DT, and a gate electrode connected to the light-emitting signal line 715. The ninth transistor T9 may be turned on or off in response to the light-emitting signal EM(N). The ninth transistor T9 may respond to the light-emitting signal EM(N) at a low level, i.e., a turn-on level.

The tenth transistor T10 may be connected to at least one of the driving transistor DT, the sixth transistor T6, the fourth-first transistor T41, the fourth-second transistor T42, and the light-emitting signal line 715. The tenth transistor T10 may be connected to the driving transistor DT and the sixth transistor T6 through the third node N3. The tenth transistor T10 may include a first electrode connected to the third node N3, a second electrode connected to the fourth-first transistor T41 and the fourth-second transistor T42, and a gate electrode connected to the light-emitting signal line 715. The tenth transistor T10 may be turned on or off in response to the light-emitting signal EM(N). The tenth transistor T10 may respond to the light-emitting signal EM(N) at the low level, i.e., the turn-on level. The tenth transistor T10 may define a current path between the driving transistor DT, the fourth-first transistor T41, and the first light-emitting element ED1 or a current path between the driving transistor DT, the fourth-second transistor T42, and the second light-emitting element ED2.

In the aspect, in case that active areas of the display apparatus are disposed in N columns and M rows, the first scan signal Scan (N) may include a scan signal to be provided to pixel circuits disposed in an N-th row. The second scan signal Scan (N-1) may include a scan signal to be provided to pixel circuits disposed in an (N-1) th row. In the present disclosure, the description will be made on the assumption that the first scan signal Scan (N) is a scan signal to be provided to the N-th row and the second scan signal Scan (N-1) is a scan signal to be provided to the (N-1) th row. However, the present disclosure is not limited thereto. The first scan signal Scan (N) and the second scan signal Scan (N-1) may be configured as different signals to be provided to the same row.

The capacitor (or storage capacitor) Cst includes a first electrode connected to the first node N1, and a second electrode connected to the second node N2. The first electrode of the capacitor Cst may be connected to the first transistor T1 and the third transistor T3. The second electrode of the capacitor Cst may be connected to the gate electrode of the driving transistor DT, the sixth transistor T6, and the eighth transistor T8.

In the aspect, the reference voltage Vref and the initialization voltage Vini may have predesignated voltage values. The reference voltage Vref may have a higher voltage value than the initialization voltage Vini. For example, the reference voltage Vref may have a voltage value corresponding to a range of 2.0 V or higher and 2.5 V or lower. The initialization voltage Vini may have a voltage value corresponding to a range of 0 V or higher and 1.0 V or lower.

Figure 8:
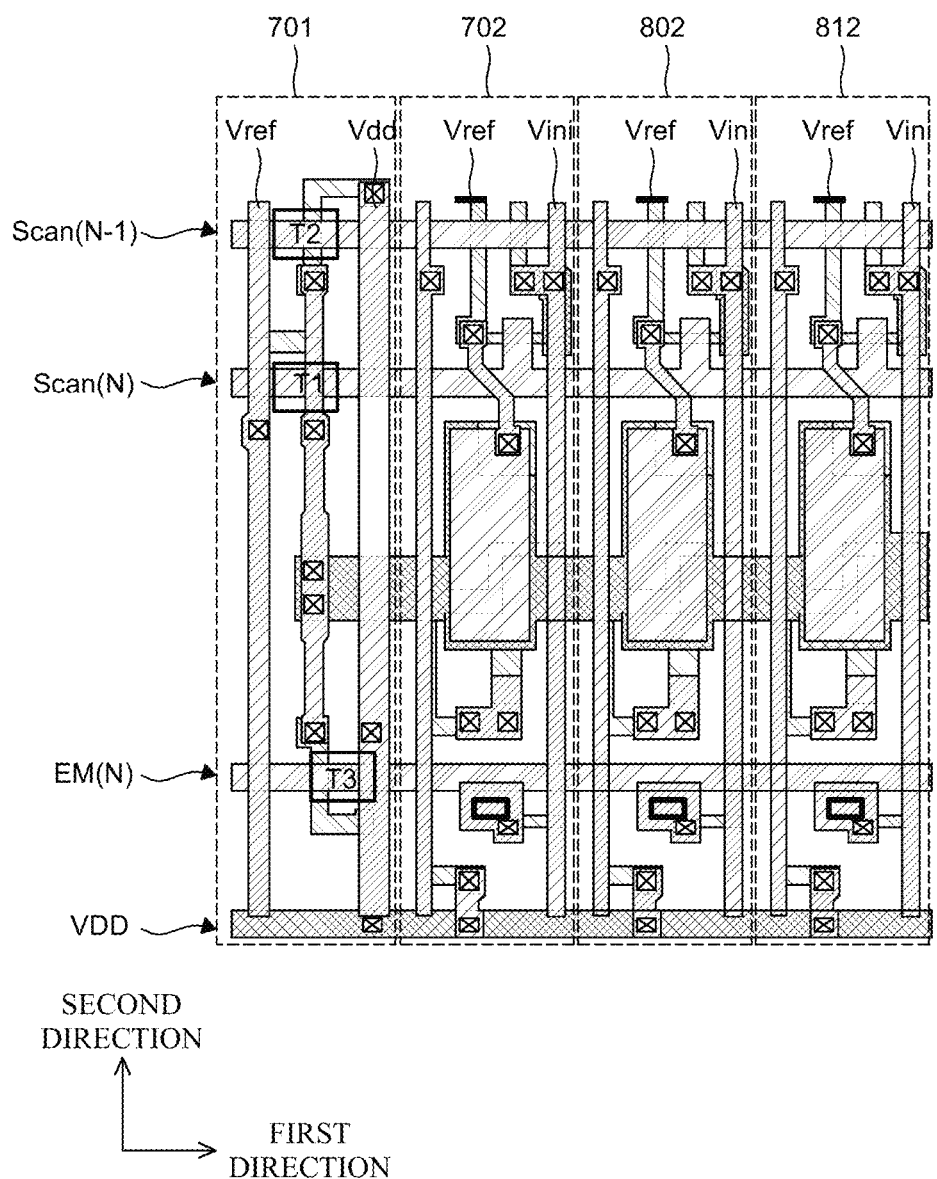
FIG. 8 is a view illustrating an implementation example of the shared circuit and the pixel circuit of the display apparatus according to the aspect of the present disclosure.

FIG. 8 is a view illustrating an implementation example of the shared circuit and the pixel circuits of the display apparatus according to an aspect of the present disclosure. FIG. 8 illustrates implementation examples of one shared circuit 701 and three pixel circuits 702, 802, and 812 connected to the shared circuit 701. FIG. 8 illustrates an example of one of the pixels disposed in the N-th row.

With reference to FIG. 8, one pixel may include a plurality of subpixels. The plurality of subpixels may each be operated by the shared circuit 701 and the pixel circuits 702, 802, and 812. Hereinafter, for convenience of description, the pixel circuits 702, 802, and 812, which constitute the pixel, may be respectively referred to as a first pixel circuit 702, a second pixel circuit 802, and a third pixel circuit 812.

In the aspect, the second pixel circuit 802 may include at least two light-emitting elements adjacent to at least one of the first pixel circuit 702 and the third pixel circuit 812 and configured to emit light different in color from the light emitted by the first and second light-emitting elements of the first pixel circuit 702. The third pixel circuit 812 may include at least two light-emitting elements adjacent to at least one of the first pixel circuit 702 and the second pixel circuit 802 and configured to emit light different in color from the light emitted from the first and second light-emitting elements of the first pixel circuit 702 and the light emitted from at least two light-emitting elements of the second pixel circuit 802.

In the aspect, a first subpixel, which emits light with a first color, may include the shared circuit 701 and the first pixel circuit 702. A second subpixel, which emits light with a second color, may include the shared circuit 701 and the second pixel circuit 802. A third subpixel, which emits light with a third color, may include the shared circuit 701 and the third pixel circuit 812.

The first pixel circuit 702, the second pixel circuit 802, and the third pixel circuit 812 may share the shared circuit 701. For example, as illustrated, one shared circuit 701 is present in the pixel circuit of one pixel, the shared circuit 701 and the first pixel circuit 702 may be electrically connected while sharing the node, and the second pixel circuit 802 and the third pixel circuit 812 may be electrically connected while sharing the node.

In the aspect, the shared circuit 701 may include the first transistor T1 (e.g., the first transistor T1 in FIG. 7), the second transistor T2 (e.g., the second transistor T2 in FIG. 7), and the third transistor T3 (e.g., the third transistor T3 in FIG. 7). The shared circuit 701 may include the first node N1, and the first node N1 may be connected to the first pixel circuit 702, the second pixel circuit 802, and the third pixel circuit 812. Therefore, the shared circuit 701 may allow the signal, which is to be provided to the first node N1, to be provided in common to the first pixel circuit 702, the second pixel circuit 802, and the third pixel circuit 812.

With reference to FIG. 8, lines for providing various signals may be disposed in the pixel. For example, the first scan signal line for providing the first scan signal Scan(N) in a first direction (or x-axis) may be disposed, the second scan signal line for providing the second scan signal Scan(N−1) may be disposed, the light-emitting signal line for providing the light-emitting signal EM(N) may be disposed, and the high-potential voltage line for providing the high-potential voltage VDD may be disposed. The reference voltage line for providing the reference voltage Vref in a second direction (or y-axis) may be disposed, the high-potential voltage line for providing the high-potential voltage VDD may be disposed, the data voltage line for providing the data voltage Vdata may be disposed, and the initialization voltage line for providing the initialization voltage Vini may be disposed.

For example, as illustrated, the second scan signal line, the first scan signal line, the light-emitting signal line, and the high-potential voltage line may be disposed sequentially. The first node N1 may be disposed between the first scan signal line and the light-emitting signal line.

In the aspect, the high-potential voltage lines may be disposed in the first and second directions, thereby defining a mesh shape. The reference voltage line and the high-potential voltage line, which are disposed in the second direction, may be disposed to overlap at least a part of the shared circuit 701. The data voltage line and the initialization voltage line may be disposed in each of the subpixel circuits. For example, as illustrated, the data voltage line and the initialization voltage line may be disposed to overlap at least a part of the first pixel circuit 702. The reference voltage line and the high-potential voltage line may be disposed in each of the plurality of pixel circuits (e.g., the first pixel circuit 702, the second pixel circuit 802, and the third pixel circuit 812) and overlap at least a part of each of the pixel circuits.

According to the aspect, the design shape of at least one of the first pixel circuit 702, the second pixel circuit 802, and the third pixel circuit 812 may be implemented to be different from the illustrated design shape. The aspect of the present disclosure is not limited thereto.

In the aspect, the shared circuit 701 may be disposed at a first side, e. g., a left side of the pixel, and the pixel circuits may be disposed at a second side, e.g., a right side of the pixel. However, the present disclosure is not limited thereto. The shared circuit 701 may be disposed between the pixel circuits.

Figure 9:
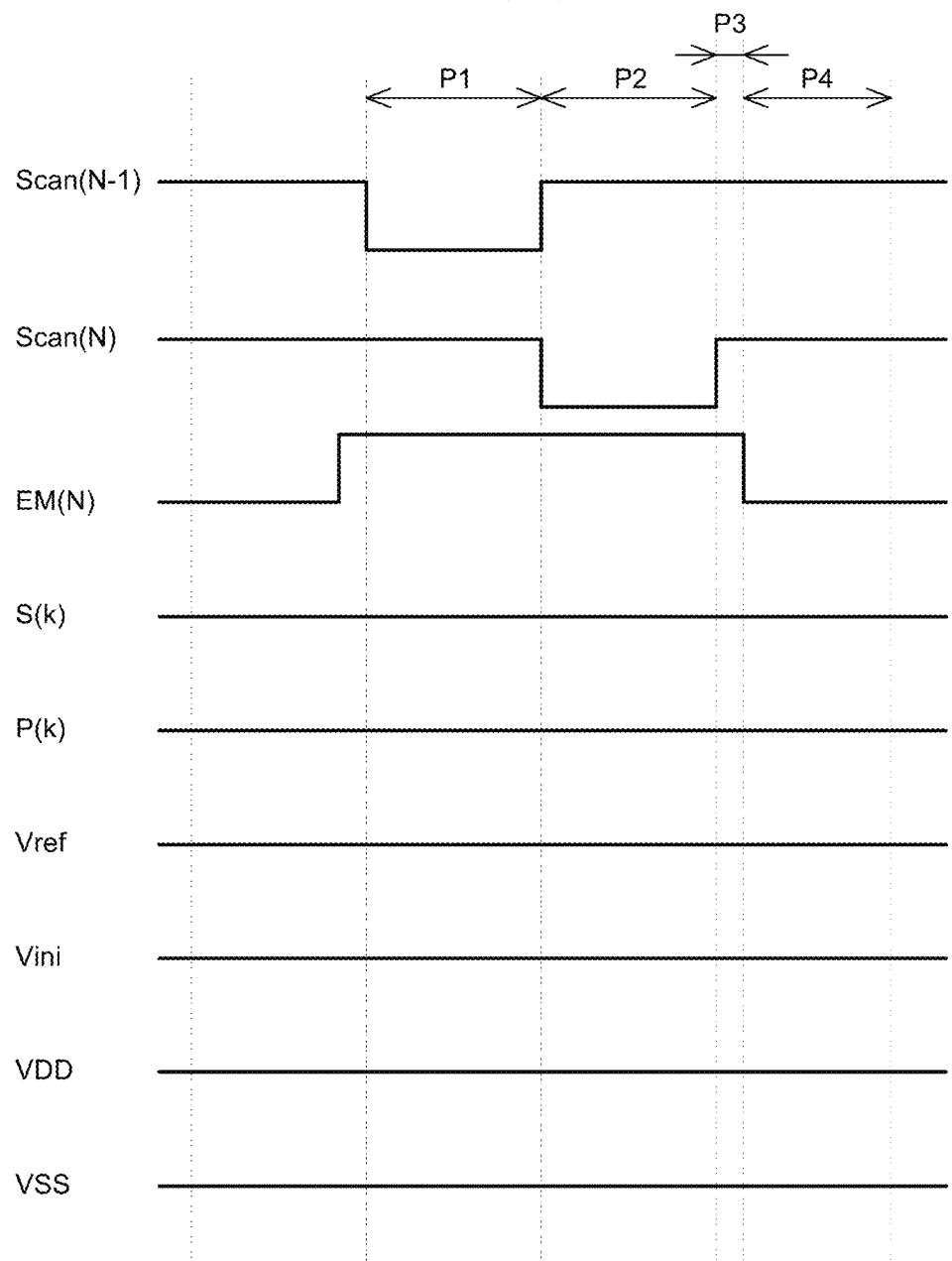
FIG. 9 is a view for explaining a signal timing of the display apparatus according to the aspect of the present disclosure.

FIG. 9 is a view for explaining a signal timing of the display apparatus according to the aspect of the present disclosure.

With reference to FIG. 9, the pixel circuit may have a plurality of operating sections. The pixel circuit may operate in an initialization (initial) section P1, a sampling section P2, a holding section P3, and a light-emitting (emission) section P4. In some instances, the sections may be denoted by other names. For example, the initialization section P1 may be referred to as a first drive section, the sampling section P2 may be referred to as a second drive section, the holding section P3 may be referred to as a third drive section, and the light-emitting section P4 may be referred to as a fourth drive section. However, the present disclosure is not limited by these terms.

In the aspect, in each of the drive sections, the pixel circuit may be provided with the first scan signal Scan (N), the second scan signal Scan (N−1), the light-emitting signal EM (N), the data voltage Vdata, the reference voltage Vref, the initialization voltage Vini, the high-potential voltage VDD, the low-potential voltage VSS, the first control signal S (k), and the second control signal P (k).

The data voltage Vdata may be changed depending on the screens to be displayed through the display apparatus. The data voltage Vdata may be an AC voltage. The reference voltage Vref, the initialization voltage Vini, the high-potential voltage VDD, and the low-potential voltage VSS are voltages having predesignated values and may be provided to the pixel circuit. At least one of the first scan signal Scan(N), the second scan signal Scan(N−1), and the light-emitting signal EM(N) may be changed depending on the drive sections.

In the aspect, the first control signal S (k) and the second control signal P (k) may be selectively provided in accordance with operation modes of the display apparatus. For example, in case that the display apparatus is intended to operate in a first mode, the first control signal S (k) may be provided as a value at a first-level (or low-level voltage), and the second control signal P (k) may be provided as a value at a second level (or high-level voltage). In case that the display apparatus is intended to operate in a second mode, the first control signal S (k) may be provided as a value at the second level, and the second control signal P (k) may be provided as a value at the first level.

In the aspect, the initialization section P1 may be performed before the data voltage Vdata is supplied. In the initialization section P1, the second scan signal Scan (N−1) may be inputted as a low-level voltage. In the initialization section P1, the first scan signal Scan (N) and the light-emitting signal EM (N) may be inputted as high-level voltages. As the second scan signal Scan (N−1) is inputted as a low-level voltage, the second transistor T2 and the eighth transistor T8 may be turned on. In this case, the high-potential voltage VDD may be provided to the first node N1 through the second transistor T2, and the initialization voltage Vini may be provided to the second node N2 through the eighth transistor T8.

In the aspect, the initialization section P1 may be maintained for the time for which the light-emitting signal EM (N) and the first scan signal Scan (N) are inputted as high-level voltages and the second scan signal Scan (N−1) is inputted as a low-level voltage. For example, the initialization section P1 may end when the first scan signal Scan (N) changes from the high-level voltage to the low-level voltage and the second scan signal Scan (N−1) changes from the low-level voltage to the high-level voltage. The time point (or point) at which the signal changes from the low-level voltage to the high-level voltage may be referred to as a rising time. The time point at which the signal changes from the high-level voltage to the low-level voltage may be referred to as a falling time. A more specific example of the initialization section P1 will be described with reference to FIG. 10.

In the aspect, the first scan signal Scan (N) may be inputted as a low-level voltage on the basis that the initialization section P1 ends. The second scan signal Scan (N−1) may be inputted as high-level voltage on the basis that the initialization section P1 ends.

In the aspect, the sampling section P2 may be performed while the data voltage Vdata is supplied to the pixel circuit. In the sampling section P2, the light-emitting signal EM (N) may be inputted as a high-level voltage. In the sampling section P2, the first scan signal Scan (N) may be inputted as a low-level voltage, and the second scan signal Scan (N−1) may be inputted as a high-level voltage.

According to the aspect, as the first scan signal Scan (N) is inputted as a low-level voltage in the sampling section P2, the first transistor T1, the fifth transistor T5, the sixth transistor T6, the seventh-first transistor T71, and the seventh-second transistor T72 may be turned on. A more specific example of the sampling section P2 will be described with reference to FIG. 11.

In the aspect, the rising time of the light-emitting signal EM (N) may be positioned by a predetermined time before a start time point of the initialization section P1. This is to allow the initialization section P1 to operate stably. The falling time of the light-emitting signal EM (N) may be positioned by a predetermined time after an end time point of the sampling section P2. This is to allow the sampling section P2 to operate stably. However, the present disclosure is not limited thereto. In some instances, the rising time may correspond to the end time point of the sampling section P2.

In the aspect, the holding section P3 may be a section for maintaining a state of a start point of the holding section P3 or a state of an end point of the sampling section P2. The pixel circuit may be kept in a constant state for the holding section P3. For example, in the holding section P3, a state made immediately after the sampling section P2, i.e., a state, in which no voltage is applied to the pixel circuit as if the application of the voltage is stopped for a moment, may be maintained constantly.

According to the aspect, in the holding section P3, the light-emitting signal EM (N), the first scan signal Scan (N), and the second scan signal Scan (N−1) may be inputted as high-level voltages.

In the aspect, the light-emitting section P4 may be initiated on the basis that the light-emitting signal EM (N) changes from the high-level voltage to the low-level voltage. In the light-emitting section P4, the first light-emitting element ED1 and/or the second light-emitting element ED2 may emit light. In the light-emitting section P4, the first scan signal Scan (N) and the second scan signal Scan (N−1) may be inputted as high-level voltages. In the light-emitting section P4, the light-emitting signal EM (N) may be inputted as a low-level voltage. A more specific example of the light-emitting section P4 will be described with reference to FIG. 12 and/or FIG. 13.

In the aspect, the initialization section P1, the sampling section P2, the holding section P3, and the light-emitting section P4 may be sequentially performed. However, the present disclosure is not limited thereto. In some instances, another section may be added between at least two sections, or at least one section may be excluded.

Figure 10:
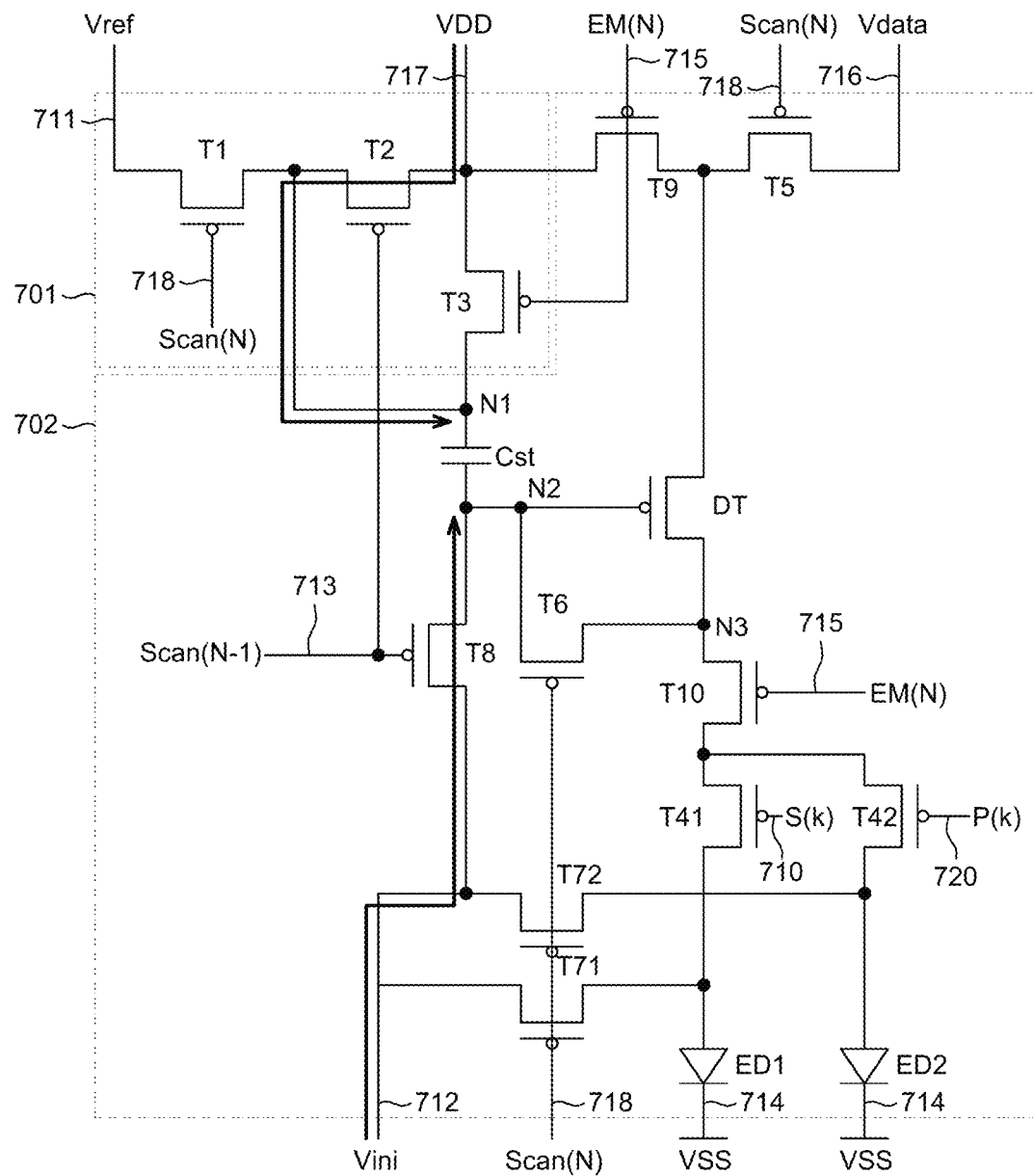
FIG. 10 is a view for explaining an operation of the pixel circuit in an initialization section of the display apparatus according to the aspect of the present disclosure.

FIG. 10 is a view for explaining an operation of the pixel circuit in the initialization section of the display apparatus according to the aspect of the present disclosure. The drive sections of the pixel circuit will be described with reference to FIG. 9.

With reference to FIG. 10, in the initialization section (e.g., the initialization section P1 in FIG. 9), as the second scan signal Scan(N−1) is inputted as a low-level voltage, the second transistor T2 and the eighth transistor T8 may be turned on.

In this case, the high-potential voltage VDD may be inputted to the first node N1 through the second transistor T2. The initialization voltage Vini may be inputted to the second node N2 through the eighth transistor T8. As the initialization voltage Vini is inputted to the second node N2, the voltage of the second node N2 may be changed to be close to a value of the initialization voltage Vini. In this case, the first node N1 may be connected to the first electrode of the capacitor Cst, and the second node N2 may be connected to the second electrode of the capacitor Cst.

In this case, the reference voltage Vref may be inputted to the third node N3 through the fifth transistor T5. The initialization voltage Vini may be inputted to the second node N2 through the fourth-second transistor T42, the second transistor T2, the third transistor T3, and a seventh transistor T7. As the initialization voltage Vini is inputted to the second node N2, the voltage of the second node N2 may be changed to be close to a value of the initialization voltage Vini.

In the aspect, in the initialization section, the first control signal S (k) and the second control signal P (k) may be inputted as high-level voltages. In this case, the fourth-first transistor T41 and the fourth-second transistor T42 may be in a turned-off state.

Figure 11:
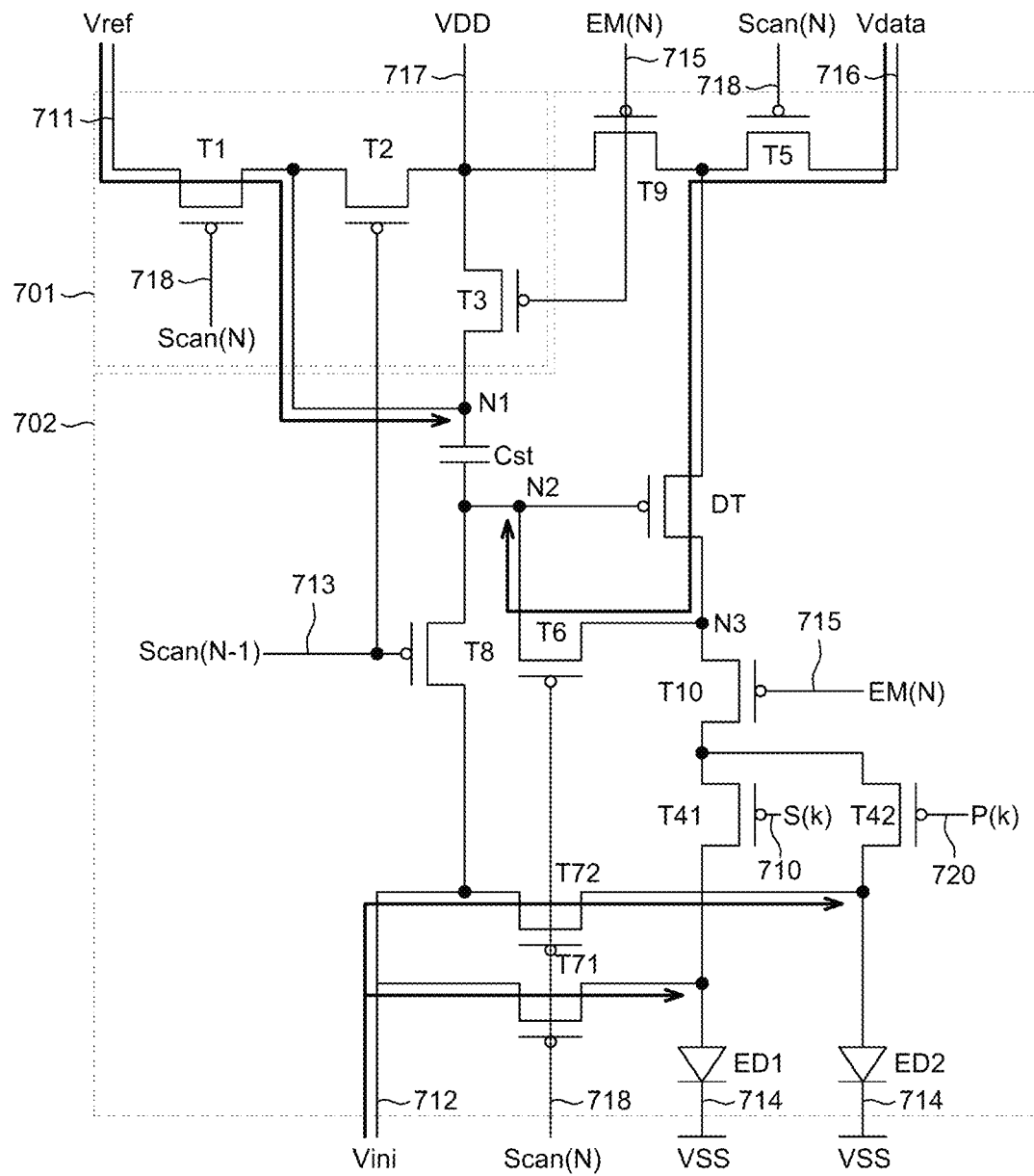
FIG. 11 is a view for explaining an operation of the pixel circuit in a sampling section of the display apparatus according to the aspect of the present disclosure.

FIG. 11 is a view for explaining an operation of the pixel circuit in the sampling section of the display apparatus according to the aspect of the present disclosure.

With reference to FIG. 11, in the sampling section (e.g., the sampling section P2 in FIG. 9), the first scan signal Scan(N) may be inputted as a low-level voltage. The second scan signal Scan(N−1) and the light-emitting signal EM(N) may be inputted as high-level voltages. In this case, in the sampling section, the first transistor T1, the fifth transistor T5, the sixth transistor T6, the seventh-first transistor T71, and the seventh-second transistor T72 may be turned on.

In the aspect, as the seventh-first transistor T71 and the seventh-second transistor T72 are turned on, the initialization voltage Vini may be provided to the anode electrode of the first light-emitting element ED1 and the anode electrode of the second light-emitting element ED2 via the seventh-first transistor T71 and the seventh-second transistor T72. As the first transistor T1 is turned on, the reference voltage Vref may be provided to the first node N1 via the first transistor T1. As the fifth transistor T5 and the sixth transistor T6 are turned on, the data voltage Vdata may be provided to the second node N2 via the fifth transistor T5 and the sixth transistor T6. The first electrode of the capacitor Cst may be charged with the reference voltage Vref, and the second electrode of the capacitor Cst may be charged with the data voltage Vdata. In this case, data writing may be performed.

In the aspect, the voltage of the second node N2 may gradually increase to a value corresponding to a difference between the high-potential voltage VDD and a threshold voltage Vth.

The holding section (e.g., the holding section P3 in FIG. 9) may be initiated after the sampling section (e.g., the sampling section P2 in FIG. 9) in FIG. 11. In the holding section, the first scan signal Scan(N), the second scan signal Scan(N–1), and the light-emitting signal EM(N) may be provided as high-level voltages. In this case, the transistors, e.g., the driving transistor DT and the first to tenth transistors T1 to T10 included in the pixel circuit may be turned off. Therefore, the state of the sampling section may be maintained without a separate electric current flow occurring in the pixel circuit.

Figure 12:
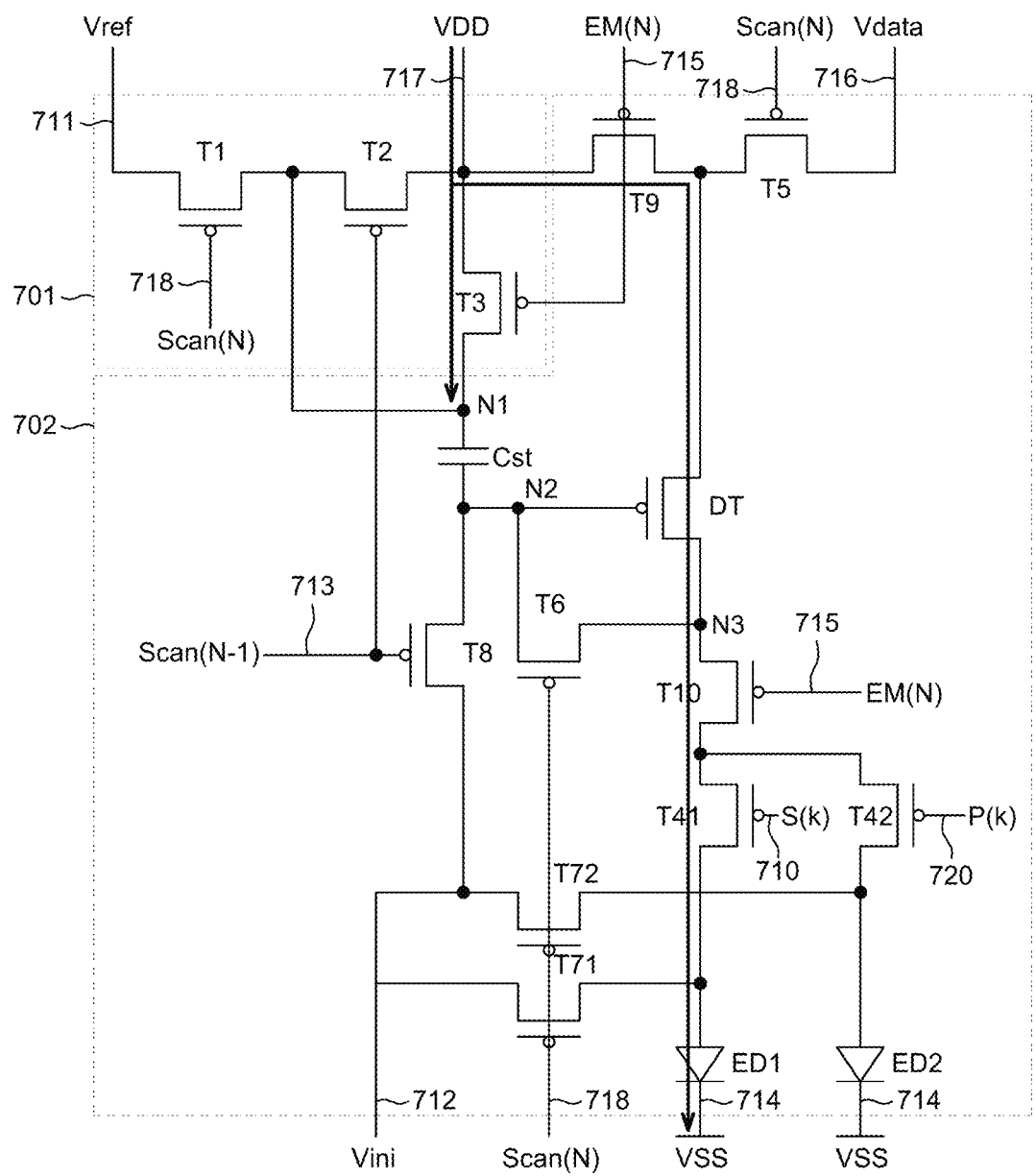
FIGS. 12 and 13 are views for explaining an operation of the pixel circuit in a light-emitting section of the display apparatus according to the aspect of the present disclosure.
Figure 13:
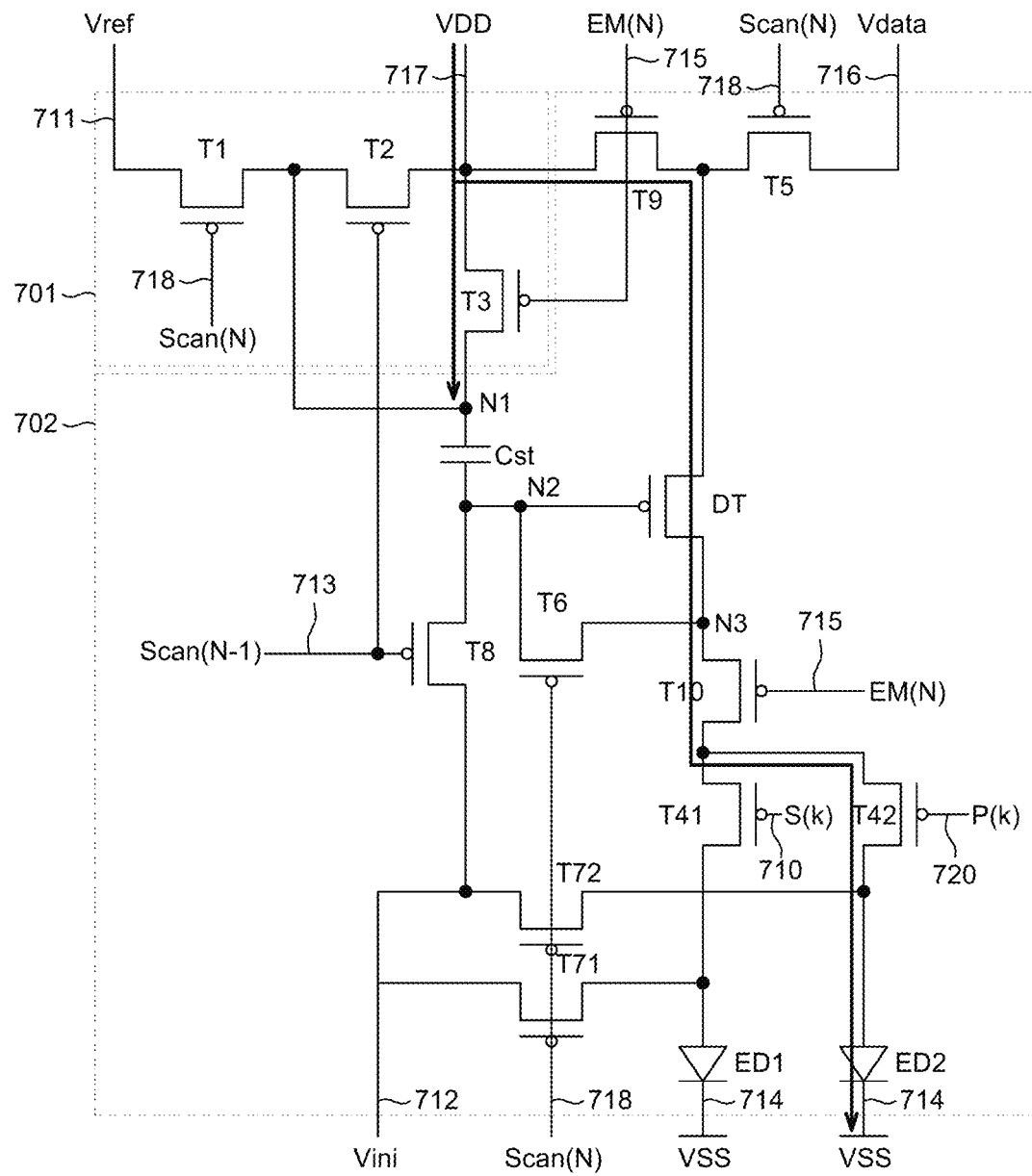

FIGS. 12 and 13 are views for explaining an operation of the pixel circuit in the light-emitting section of the display apparatus according to the aspect of the present disclosure.

FIG. 12 may illustrate a case in which the first control signal S(k) is provided as a low-level voltage. FIG. 13 may illustrate a case in which the second control signal P(k) is provided as a low-level voltage. The first control signal S(k) and the second control signal P(k) are signals provided individually. The two signals having low-level voltages may be provided simultaneously or provided at different time points.

With reference to FIG. 12, in the light-emitting section, the light-emitting signal EM(N) and the first control signal S(k) may be inputted as low-level voltages. The first scan signal Scan(N) and the second scan signal Scan(N–1) may be inputted as high-level voltages. In this case, the third transistor T3, the ninth transistor T9, the tenth transistor T10, and the fourth-first transistor T41 may be turned on.

In the aspect, the first control signal S (k) with the low-level voltage may be provided on the basis that the pixel circuit operates in the first mode. The first mode may include a mode in which the content is provided to both the driver seat and the passenger seat. The second mode to be described below may include a mode in which a visual field of the driver seat is restricted, and the content is provided to the passenger seat. The viewing angle in the first mode may be larger than the viewing angle in the second mode.

In the aspect, in case that the pixel circuit operates in the first mode, the driving transistor DT, the third transistor T3, the ninth transistor T9, the tenth transistor T10, and the fourth-first transistor T41 may be turned on to define the current path. The high-potential voltage VDD may be inputted to the anode electrode of the first light-emitting element ED1. Therefore, the first light-emitting element ED1 may emit light.

With reference to FIG. 13, in the light-emitting section, the light-emitting signal EM(N) and the second control signal P(k) may be inputted as low-level voltages. The first scan signal Scan(N) and the second scan signal Scan(N–1) may be inputted as high-level voltages. In this case, the third transistor T3, the ninth transistor T9, the tenth transistor T10, and the fourth-second transistor T42 may be turned on.

In the aspect, in case that the pixel circuit operates in the second mode, the driving transistor DT, the third transistor T3, the ninth transistor T9, the tenth transistor T10, and the fourth-second transistor T42 may be turned on to define the current path. The high-potential voltage VDD may be inputted to the anode electrode of the second light-emitting element ED2. Therefore, the second light-emitting element ED2 may emit light.

Figure 14:
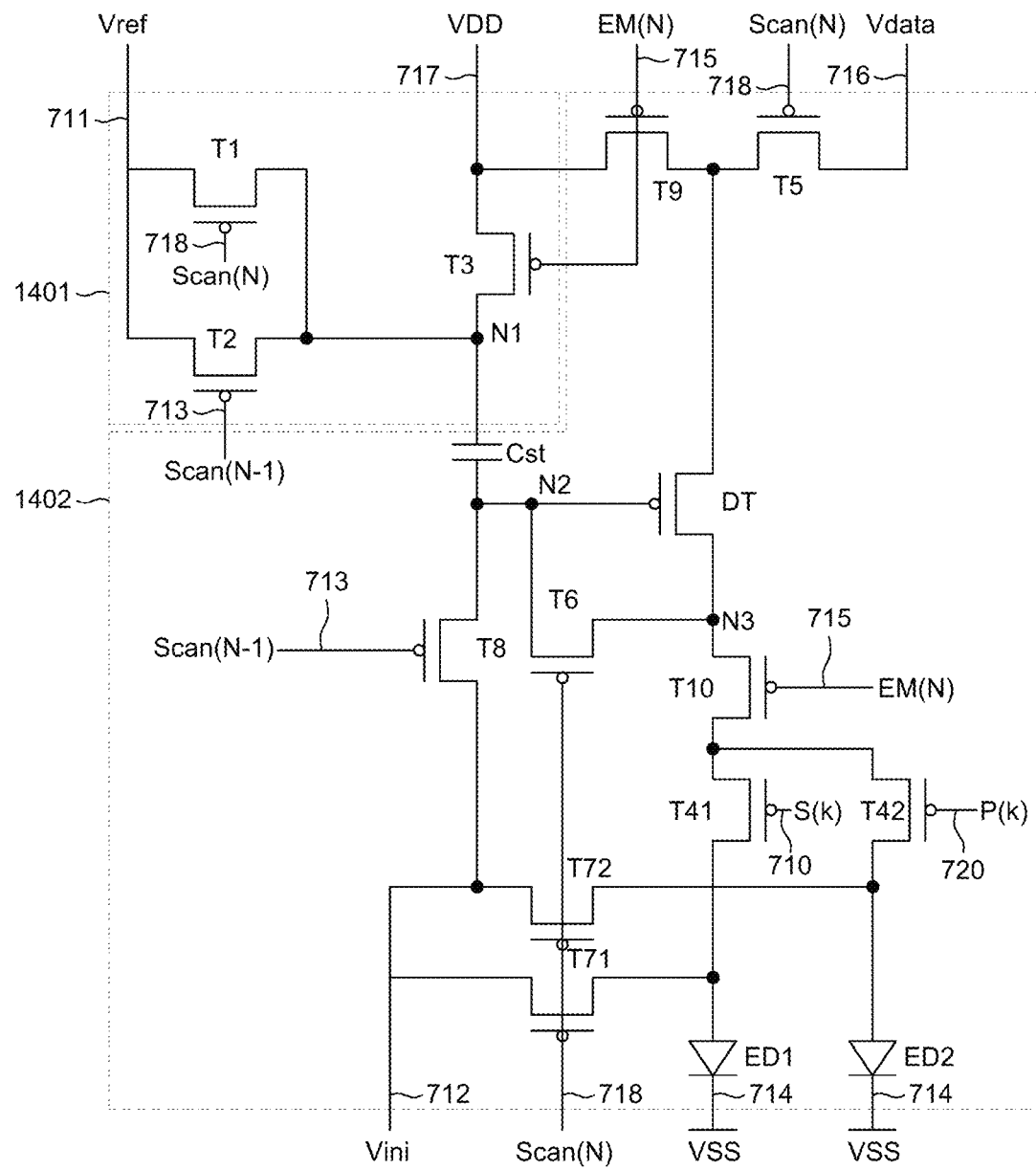
FIG. 14 is a view illustrating a shared circuit and a pixel circuit of a display apparatus according to another aspect of the present disclosure.

FIG. 14 is a view illustrating a pixel circuit of a display apparatus according to another aspect of the present disclosure. A shared circuit 1401 in FIG. 14 is an aspect distinguished from the shared circuit 701 in FIG. 7. A pixel circuit 1402 in FIG. 14 may be identical to the pixel circuit 702 in FIG. 7.

With reference to FIG. 14, the pixel may include the shared circuit 1401 and the pixel circuit 1402. In the aspect, the shared circuit 1401 may include the first transistor T1 and the second transistor T2 connected in parallel. For example, the first transistor T1 and the second transistor T2 of a shared circuit 1501 may be connected in parallel between the reference voltage line and the first node N1.

The first electrode of the first transistor T1 and the first electrode of the second transistor T2 may be connected to the reference voltage line configured to provide the reference voltage Vref. The second electrode of the first transistor T1 and the second electrode of the second transistor T2 may be connected to the third transistor T3. The first transistor T1 may be controlled by the first scan signal Scan(N), and the second transistor T2 may be controlled by the second scan signal Scan(N–1).

The circuit in FIG. 14 may have the initialization section, the sampling section, the holding section, and the light-emitting section. The signal timing in each of the sections may operate in the same way as that illustrated in FIG. 9. However, the present disclosure is not limited thereto.

Figure 15:
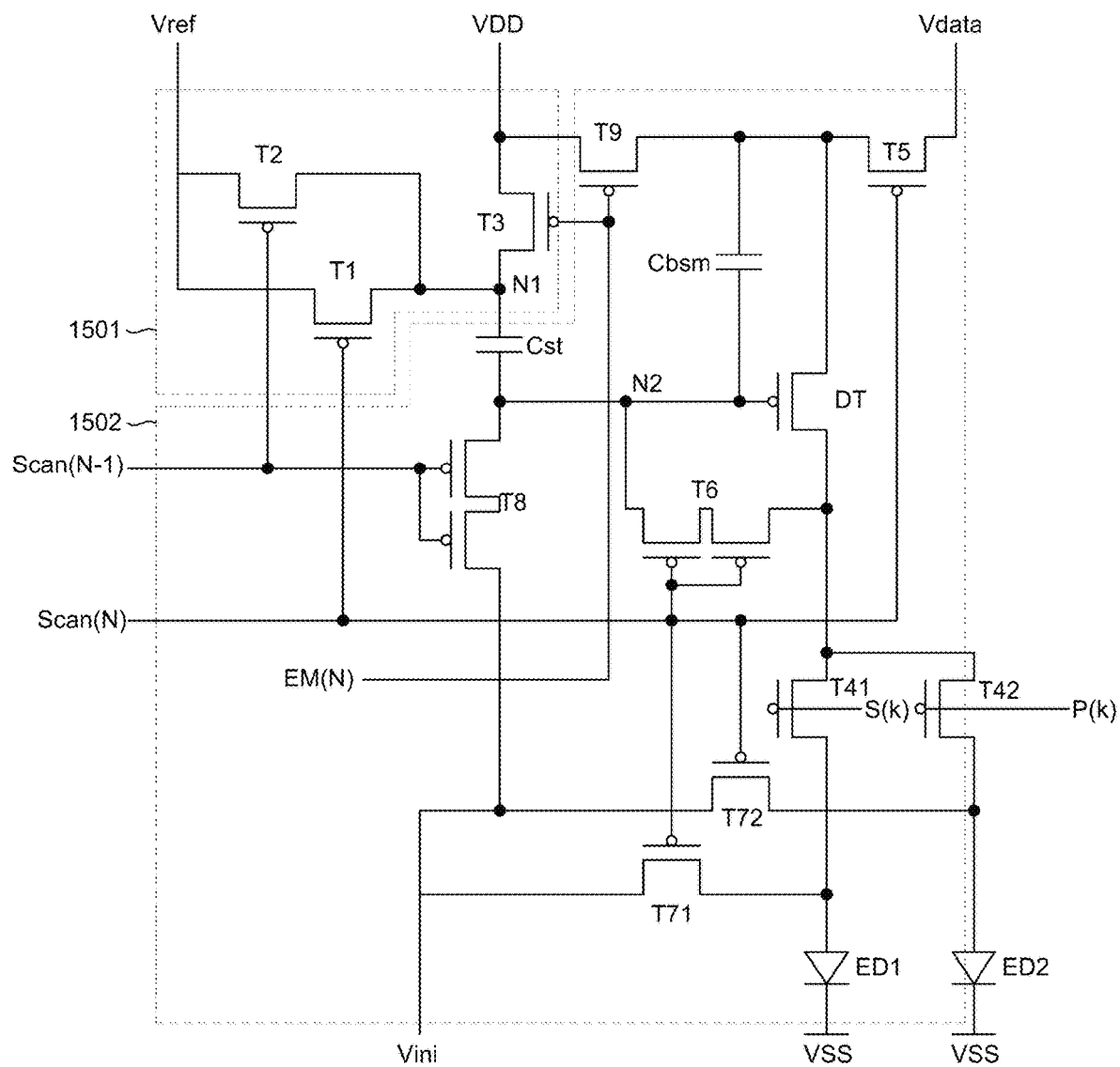
FIG. 15 is a view illustrating a shared circuit and a pixel circuit of a display apparatus according to still another aspect of the present disclosure.

FIG. 15 is a view illustrating a shared circuit and a pixel circuit of a display apparatus according to still another aspect of the present disclosure. An aspect will be described in which the shared circuit 1501 in FIG. 15 is identical to the shared circuit 1401 in FIG. 14, and a pixel circuit 1502 is different in shape from the pixel circuit 1402 in FIG. 14 and/or the pixel circuit 702 in FIG. 7.

With reference to FIG. 15, the first transistor T1 and the second transistor T2 of the shared circuit 1501 may be connected in parallel between the reference voltage line and the first node N1. In comparison with the pixel circuit 702 in FIG. 7, the pixel circuit 1502 may further include an additional capacitor Cbsm connected between the gate electrode and the first electrode of the driving transistor DT.

In the aspect, the sixth transistor T6 and/or the eighth transistor T8 may each include a transistor configured as a double gate. In this case, a leakage current is blocked in the sixth transistor T6 and/or the eighth transistor T8, such that the pixel circuit may operate more stably.

Although not illustrated, according to the aspect, the pixel circuit 702 in FIG. 7 may be configured in the same way as the pixel circuit 1502 in FIG. 15. Even in this case, the signal timing in FIG. 9 may be maintained.

A pixel circuit and a display apparatus according to the exemplary aspects of the present disclosure may also be described as follows:

A display apparatus according to an exemplary aspect of the present disclosure includes a mode controller configured to generate a first control signal and a second control signal, a gate drive circuit configured to generate a light-emitting signal, a first scan signal, and a second scan signal, a shared circuit connected to a reference voltage line configured to provide a reference voltage, the shared circuit comprising a first transistor configured to operate based on the first scan signal, and a second transistor connected to the first transistor in series and configured to operate based on the second scan signal and a first pixel circuit connected to the mode controller and the gate drive circuit, wherein the first pixel circuit includes a driving transistor, a third transistor configured to operate based on the light-emitting signal and connected to the second transistor, a fourth-first transistor configured to operate based on the first control signal, a fourth-second transistor configured to operate based on the second control signal, a first light-emitting element connected to the fourth-first transistor, a second light-emitting element connected to the fourth-second transistor and a capacitor connected to the first transistor, the second transistor, the third transistor, and the driving transistor.

In the aspects, the display apparatus may further include a second pixel circuit comprising at least two light-emitting elements adjacent to the first pixel circuit and configured to emit light different in color from light emitted from the first and second light-emitting elements, wherein the second pixel circuit is connected to the shared circuit.

In the aspects, a first electrode of the third transistor may be connected to a high-potential voltage line and a second electrode of the second transistor, and a second electrode of the third transistor may be connected to a first electrode of the second transistor and the capacitor.

In the aspects, a first electrode of the first transistor may be connected to the reference voltage line, and a second electrode of the first transistor may be connected to the second transistor.

In the aspects, a first electrode of the second transistor may be connected to at least one of the first transistor, the third transistor, and the capacitor, and a second electrode of the second transistor may be connected to at least one of a high-potential voltage line and the third transistor.

In the aspects, a first electrode of the third transistor may be connected to the high-potential voltage line and the second electrode of the second transistor, and a second electrode of the third transistor may be connected to the first electrode of the second transistor and the capacitor.

In the aspects, the display apparatus may further include a fifth transistor connected to the driving transistor and a data voltage line and configured to operate based on the first scan signal and a sixth transistor connected to a gate electrode of the driving transistor and configured to operate based on the first scan signal.

In the aspects, the display apparatus may further include a seventh-first transistor connected to an initialization voltage line, the fourth-first transistor, and the first light-emitting element and configured to operate based on the first scan signal and a seventh-second transistor connected to the initialization voltage line, the fourth-second transistor, and the second light-emitting element and configured to operate based on the first scan signal.

In the aspects, the display apparatus may further include an eighth transistor connected to a gate electrode of the driving transistor, the seventh-first transistor, the seventh-second transistor, and the initialization voltage line and configured to operate based on the second scan signal.

In the aspects, the display apparatus may further include a ninth transistor connected to a high-potential voltage line, the second transistor, the third transistor, and the driving transistor and configured to operate based on the light-emitting signal.

In the aspects, a first electrode of the fourth-first transistor and a first electrode of the fourth-second transistor may be connected to the driving transistor, a second electrode of the fourth-first transistor may be connected to the first light-emitting element, and a second electrode of the fourth-second transistor may be connected to the second light-emitting element.

In the aspects, the display apparatus may further include a tenth transistor connected between the driving transistor and the fourth-first transistor or between the driving transistor and the fourth-second transistor and configured to operate based on the light-emitting signal.

In the aspects, the first pixel circuit may operate in an initialization section, a sampling section, a holding section, or a light-emitting section.

In the aspects, the initialization section, the first scan signal and the light-emitting signal have a first level, and the second scan signal has a second level, wherein in the sampling section, the first scan signal has the second level, and the second scan signal and the light-emitting signal have the first level, wherein in the holding section, the first scan signal, the second scan signal, and the light-emitting signal have the first level, and wherein in the light-emitting section, the first scan signal and the second scan signal have the first level, and the light-emitting signal has the second level.

In the aspects, the first level may be higher than the second level.

Although the exemplary aspects of the present disclosure have been described in detail with reference to the accompanying drawings, the present disclosure is not limited thereto and may be embodied in many different forms without departing from the technical concept of the present disclosure. Therefore, the exemplary aspects of the present disclosure are provided for illustrative purposes only but not intended to limit the technical concept of the present disclosure. The scope of the technical concept of the present disclosure is not limited thereto. Therefore, it should be understood that the above-described exemplary aspects are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A display apparatus comprising:
   a mode controller configured to generate a first control signal and a second control signal;
   a gate drive circuit configured to generate a light-emitting signal, a first scan signal, and a second scan signal;
   a shared circuit connected to a reference voltage line and configured to provide a reference voltage, wherein the shared circuit includes a first transistor configured to operate based on the first scan signal, and a second transistor connected to the first transistor in series and configured to operate based on the second scan signal; and
   a first pixel circuit connected to the mode controller and the gate drive circuit,
   wherein the first pixel circuit comprises:
   a driving transistor;
   a third transistor configured to operate based on the light-emitting signal and connected to the second transistor;
   a fourth-first transistor configured to operate based on the first control signal;
   a fourth-second transistor configured to operate based on the second control signal;

a first light-emitting element connected to the fourth-first transistor;

a second light-emitting element connected to the fourth-second transistor; and a capacitor connected to the first transistor, the second transistor, the third transistor, and the driving transistor.

2. The display apparatus of claim 1, further comprising a second pixel circuit comprising at least two light-emitting elements adjacent to the first pixel circuit and configured to emit light having a different color from light emitted from the first and second light-emitting elements, wherein the second pixel circuit is connected to the shared circuit.

3. The display apparatus of claim 2, wherein a first electrode of the third transistor is connected to a high-potential voltage line and a second electrode of the second transistor, and a second electrode of the third transistor is connected to a first electrode of the second transistor and the capacitor.

4. The display apparatus of claim 1, wherein a first electrode of the first transistor is connected to the reference voltage line, and a second electrode of the first transistor is connected to the second transistor.

5. The display apparatus of claim 1, wherein a first electrode of the second transistor is connected to at least one of the first transistor, the third transistor, and the capacitor, and a second electrode of the second transistor is connected to at least one of a high-potential voltage line and the third transistor.

6. The display apparatus of claim 5, wherein a first electrode of the third transistor is connected to the high-potential voltage line and the second electrode of the second transistor, and a second electrode of the third transistor is connected to the first electrode of the second transistor and the capacitor.

7. The display apparatus of claim 1, further comprising a fifth transistor connected to the driving transistor and a data voltage line and configured to operate based on the first scan signal; and a sixth transistor connected to a gate electrode of the driving transistor and configured to operate based on the first scan signal.

8. The display apparatus of claim 1, further comprising a seventh-first transistor connected to an initialization voltage line, the fourth-first transistor, and the first light-emitting element and configured to operate based on the first scan signal; and a seventh-second transistor connected to the initialization voltage line, the fourth-second transistor, and the second light-emitting element and configured to operate based on the first scan signal.

9. The display apparatus of claim 8, further comprising an eighth transistor connected to a gate electrode of the driving transistor, the seventh-first transistor, the seventh-second transistor, and the initialization voltage line and configured to operate based on the second scan signal.

10. The display apparatus of claim 1, further comprising a ninth transistor connected to a high-potential voltage line, the second transistor, the third transistor, and the driving transistor and configured to operate based on the light-emitting signal.

11. The display apparatus of claim 1, wherein a first electrode of the fourth-first transistor and a first electrode of the fourth-second transistor are connected to the driving transistor, a second electrode of the fourth-first transistor is connected to the first light-emitting element, and a second electrode of the fourth-second transistor is connected to the second light-emitting element.

12. The display apparatus of claim 11, further comprising a tenth transistor connected between the driving transistor and the fourth-first transistor or between the driving transistor and the fourth-second transistor and configured to operate based on the light-emitting signal.

13. The display apparatus of claim 11, wherein the first pixel circuit operates in an initialization section, a sampling section, a holding section, or a light-emitting section.

14. The display apparatus of claim 13, wherein in the initialization section, the first scan signal and the light-emitting signal have a first level, and the second scan signal has a second level, wherein in the sampling section, the first scan signal has the second level, and the second scan signal and the light-emitting signal have the first level, wherein in the holding section, the first scan signal, the second scan signal, and the light-emitting signal have the first level, and wherein in the light-emitting section, the first scan signal and the second scan signal have the first level, and the light-emitting signal has the second level.

15. The display apparatus of claim 14, wherein the first level is higher than the second level.

16. A display apparatus comprising:

a shared circuit providing a reference voltage Vref, configured to operate based on a first scan signal and a second scan signal, and including a first node N1; and first, second and third pixel circuits share the shared circuit in operation, wherein the second pixel circuit is adjacent to at least one of the first and third pixel circuits and including at least two light-emitting elements configured to emit light with a different color from light emitted from first and second light-emitting elements of the first pixel circuit, wherein the third pixel circuit is adjacent to at least one of the first and second pixel circuits and including at least two light-emitting elements configured to emit light with a different color from light emitted from first and second light-emitting elements of the first pixel circuit and first and second light-emitting elements of the second pixel circuit, and wherein the shared circuit and the first, second and third pixel circuits are electrically connected through the first node N1 to receive at least one of the reference voltage Vref, a high-potential voltage VDD, a low-potential voltage VSS, a light-emitting signal EM(N), a data voltage Vdata, and an initialization voltage Vini.

17. The display apparatus of claim 16, further comprising:

a first scan signal line providing the first scan signal Scan(N) in a first direction;

a second scan signal line providing the second scan signal Scan(N−1) in the first direction;

a light-emitting signal line providing the light-emitting signal EM(N) in the first direction; and a first high-potential voltage line providing the high-potential voltage VDD in the first direction.

18. The display apparatus of claim 17, further comprising:

a reference voltage line providing the reference voltage Vref in a second direction;

a second high-potential voltage line providing the high-potential voltage VDD in the second direction;

a data voltage line providing the data voltage Vdata in the second direction; and an initialization voltage line for providing the initialization voltage Vini in the second direction.

19. The display apparatus of claim 18, wherein the reference voltage line and the high-potential voltage line are disposed to overlap at least a part of the shared circuit.

20. The display apparatus of claim 18, wherein the data voltage line and the initialization voltage line overlap at least a part of the first pixel circuit.

21. The display apparatus of claim 18, wherein the reference voltage line and the high-potential voltage line are disposed in the first, second and third pixel circuits and overlap at least a part of the first, second and third pixel circuits.

22. The display apparatus of claim 17, wherein the first node N1 is disposed between the first scan signal line and the light-emitting signal line.

23. The display apparatus of claim 16, further comprising a high-potential voltage line disposed in the first and second directions to define a mesh shape.

* * * * *